(12) United States Patent
Ide et al.

(10) Patent No.: US 12,298,342 B2
(45) Date of Patent: May 13, 2025

(54) SEMICONDUCTOR DEVICE, INSPECTION COMPONENT, AND INSPECTION DEVICE

(71) Applicant: Kioxia Corporation, Tokyo (JP)

(72) Inventors: Kohei Ide, Kamakura (JP); Kenshi Fukuda, Kamakura (JP)

(73) Assignee: Kioxia Corporation, Tokyo (JP)

( * ) Notice: Subject to any disclaimer, the term of this patent is extended or adjusted under 35 U.S.C. 154(b) by 605 days.

(21) Appl. No.: 17/117,737

(22) Filed: Dec. 10, 2020

(65) Prior Publication Data

US 2021/0293879 A1  Sep. 23, 2021

(30) Foreign Application Priority Data

Mar. 19, 2020 (JP) .................................. 2020-049861

(51) Int. Cl.
*G01R 31/28* (2006.01)

(52) U.S. Cl.
CPC ..... *G01R 31/2887* (2013.01); *G01R 31/2889* (2013.01)

(58) Field of Classification Search
CPC ............ G01R 31/2887; G01R 31/2889; H01L 23/28–3192
See application file for complete search history.

(56) References Cited

U.S. PATENT DOCUMENTS

| | | | | |
|---|---|---|---|---|
| 5,172,049 A * | 12/1992 | Kiyokawa | .......... | G01R 31/2893 219/209 |
| 5,557,212 A * | 9/1996 | Isaac | ........................ | G01R 1/04 324/750.16 |
| 6,507,204 B1 * | 1/2003 | Kanamaru | ......... | G01R 1/06738 324/755.07 |
| 6,707,151 B2 * | 3/2004 | Noguchi | ............. | H01L 21/6835 257/737 |
| 7,609,052 B2 | 10/2009 | Mizushima et al. | | |
| 2001/0010397 A1 * | 8/2001 | Masuda | ........... | G06K 19/07732 257/E25.011 |

(Continued)

FOREIGN PATENT DOCUMENTS

| | | |
|---|---|---|
| JP | 6-82859 U | 11/1994 |
| JP | 2005-172576 A | 6/2005 |

(Continued)

*Primary Examiner* — Lee E Rodak
*Assistant Examiner* — Demetrius R Pretlow
(74) *Attorney, Agent, or Firm* — Oblon, McClelland, Maier & Neustadt, L.L.P.

(57) ABSTRACT

According to one embodiment, a semiconductor device includes a board, a plurality of external connection terminals, a semiconductor component, and an insulator. The board includes a first surface and a second surface. The second surface is located on a side opposite to the first surface. The plurality of external connection terminals is on the first surface. The semiconductor component is located on a side opposite to the plurality of external connection terminals with respect to the board. The insulator includes a first region and a second region. The first region has a first thickness in a thickness direction of the board. The second region is located on an outer peripheral side of the first region and has a second thickness thinner than the first thickness in the thickness direction. The insulator covers the semiconductor component from a side opposite to the board.

17 Claims, 18 Drawing Sheets

(56) References Cited

U.S. PATENT DOCUMENTS

| | | | |
|---|---|---|---|
| 2002/0063264 A1* | 5/2002 | Noshita | H01L 24/50 257/200 |
| 2003/0141581 A1* | 7/2003 | MacIntyre | H01L 25/105 257/E25.023 |
| 2004/0178508 A1* | 9/2004 | Nishimura | H01L 25/105 257/E25.023 |
| 2007/0200555 A1 | 8/2007 | Mizushima et al. | |
| 2010/0109141 A1* | 5/2010 | Nishiyama | H01L 24/49 257/E23.141 |
| 2012/0098115 A1* | 4/2012 | Watanabe | H01L 21/566 257/706 |
| 2013/0049227 A1* | 2/2013 | Kim | H01L 21/565 257/E21.602 |
| 2013/0109138 A1* | 5/2013 | Okada | H01L 21/56 438/127 |
| 2013/0228908 A1* | 9/2013 | Takahashi | H01L 23/49575 257/676 |
| 2015/0357251 A1* | 12/2015 | Usami | H01L 22/12 438/7 |
| 2015/0366085 A1* | 12/2015 | Shih | H01L 23/3128 361/752 |
| 2018/0348434 A1* | 12/2018 | Yim | H01L 24/97 |
| 2020/0075545 A1 | 3/2020 | Kim et al. | |
| 2022/0208636 A1* | 6/2022 | Yamane | H01L 23/28 |

FOREIGN PATENT DOCUMENTS

| | | |
|---|---|---|
| JP | 4537394 B2 | 9/2010 |
| JP | 2012-209343 A | 10/2012 |
| KR | 20120064305 A * | 6/2012 |
| TW | 202011561 A | 3/2020 |
| WO | WO 2004/068154 A1 | 8/2004 |
| WO | WO 2007/094034 A1 | 8/2007 |

\* cited by examiner

SEMICONDUCTOR DEVICE, INSPECTION COMPONENT, AND INSPECTION DEVICE

CROSS-REFERENCE TO RELATED APPLICATION

This application is based upon and claims the benefit of priority from Japanese Patent Application No. 2020-049861, filed Mar. 19, 2020; the entire contents of which are incorporated herein by reference.

FIELD

Embodiments described herein relate generally to a semiconductor device, an inspection component, and an inspection device.

BACKGROUND

An inspection device including an inspection component which presses a semiconductor device during an inspection is known.

DETAILED DESCRIPTION

Figure 1:
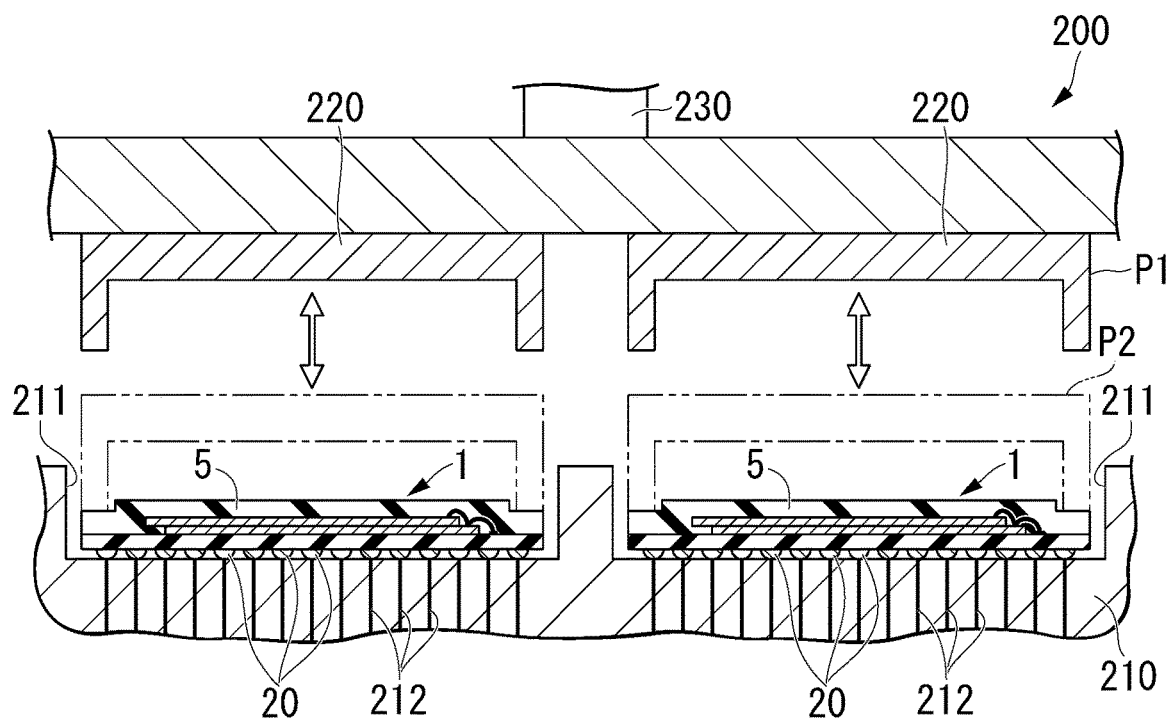
FIG. 1 is a cross-sectional view showing a semiconductor device and an inspection device according to a first embodiment.

According to one embodiment, a semiconductor device includes a board, a plurality of external connection terminals, a semiconductor component, and an insulator. The board includes a first surface and a second surface. The second surface is located on a side opposite to the first surface. The plurality of external connection terminals is on the first surface. The semiconductor component is located on a side opposite to the plurality of external connection terminals with respect to the board. The insulator includes a first region and a second region. The first region has a first thickness in a thickness direction of the board. The second region is located on an outer peripheral side of the first region and has a second thickness thinner than the first thickness in the thickness direction. The insulator covers the semiconductor component from a side opposite to the board.

Hereinafter, a semiconductor device, an inspection component, and an inspection device of an embodiment will be described with reference to the drawings. In the following description, constituents having the same or similar functions are designated by the same reference numerals. Additionally, a duplicate description of the constituents may be omitted. In the following description, "same," "parallel," and "orthogonal" may include cases of "substantially the same," "substantially parallel," and "substantially orthogonal". "Overlapping" means that virtual projections of two objects overlap each other, and may include a case in which the two objects do not face each other directly (there is another object between the two objects). A "face" means a surface and is not limited to a front face. A "connection" is not limited to a physical connection and may include an electrical connection.

First, a +X direction, a −X direction, a +Y direction, a −Y direction, a +Z direction, and a −Z direction are defined. The +X direction, the −X direction, the +Y direction, and the −Y direction are directions along a first surface 10a of a board 10 which will be described later (refer to FIG. 2). The +X direction is a direction from a third end portion 40c toward a fourth end portion 40d of a semiconductor device 1 (refer to FIG. 2). The −X direction is a direction opposite to the +X direction. When the +X direction and the −X direction are not distinguished, they are simply referred to as "X direction". The +Y direction and the −Y direction are directions which intersect (for example, are orthogonal to) the X direction. The +Y direction is a direction from a first end portion 40a toward a second end portion 40b of the semiconductor device 1 (refer to FIG. 2). The −Y direction is a direction opposite to the +Y direction. When the +Y direction and the −Y direction are not distinguished, they are simply referred to as "Y direction". The +Z direction and the −Z direction are directions which intersect (for example, are orthogonal to) the X direction and the Y direction. The +Z direction is a direction from a board 10 toward a sealing resin portion 40 (refer to FIG. 2). The −Z direction is a direction opposite to the +Z direction. When the +Z direction and the −Z direction are not distinguished, they are simply referred to as "Z direction". The Z direction is a thickness direction of the semiconductor device 1 and a thickness direction of the board 10. Hereinafter, for convenience, the +Z direction may be referred to as "upward" and the −Z direction may be referred to as "downward".

A semiconductor device may have different capabilities by changing the number of semiconductor components mounted therein. For example, in a semiconductor device such as a semiconductor storage device, a storage capacity thereof can be increased by increasing the number of semiconductor memory chips mounted therein. Here, when the number of semiconductor components mounted inside the semiconductor device is changed, a thickness of the semiconductor device may be different. When the thickness of the semiconductor device is different, it is necessary to change a type of inspection component used for inspection of the semiconductor device according to the thickness of the semiconductor device. In this case, it may be difficult to reduce the cost related to an inspection.

Therefore, in the following embodiments, a semiconductor device, an inspection component, and an inspection device which may reduce the cost related to the inspection even when a plurality of types (for example, two types) of semiconductor devices having different thicknesses are present will be described. However, the present invention is not limited to the embodiments which will be described below.

First Embodiment

<1. Overall Constitution Related to Inspection>

FIG. 1 is a cross-sectional view showing a semiconductor device 1 and an inspection device 200 of a first embodiment. The semiconductor device 1 is a so-called semiconductor package and includes a main body 5 in which a semiconductor component is mounted and a plurality of external connection terminals 20 exposed to the outside of the semiconductor device 1. Details of the semiconductor device 1 will be described later.

The inspection device (a tester) 200 includes, for example, a base 210, inspection components 220, and a moving mechanism 230. The base 210 is fixed to an installation surface such as a floor surface. The base 210 has a receiving portion (a component socket) 211 on which the semiconductor device 1 is to be mounted. A plurality of inspection terminals (measurement terminals) 212 are provided on a bottom of the receiving portion 211. In a case where the semiconductor device 1 is placed on the receiving portion 211, the inspection terminals 212 come into contact with the external connection terminals 20 of the semiconductor device 1 and are electrically connected to the inside of the semiconductor device 1 through the external connection terminals 20.

The inspection component 220 is, for example, a pressing component called a pusher, and is disposed on a side opposite to the receiving portion 211 with respect to the semiconductor device 1. The moving mechanism 230 moves the inspection component 220 toward the receiving portion 211. For example, the moving mechanism 230 moves the inspection component 220 up and down. The moving mechanism 230 is moved between a first position P1 at which the inspection component 220 is spaced apart from the semiconductor component 1 and a second position P2 at which the inspection component 220 is in contact with the semiconductor device 1 and presses the semiconductor device 1 toward the inspection terminals 212 of the receiving portion 211. A contact state between the external connection terminals 20 of the semiconductor device 1 and the inspection terminals 212 of the inspection device 220 is stabilized by moving the inspection component 220 to the second position P2. In this state, electrical characteristics (for example, the presence or absence of abnormality) of the semiconductor device 1 are inspected through the inspection terminals 212. For example, the moving mechanism 230 is constituted of a simple mechanism, it is difficult to move the inspection component 220 to an arbitrary height position, and it is possible to move the inspection component 220 only to two positions of the first position P1 and the second position P2.

In the inspection device 200 of the embodiment, a plurality of types of semiconductor devices 1 having different thicknesses (different dimensions in the Z direction) can be pressed by one type of inspection component 220. In the following, first, two types of semiconductor devices 1Aa and 1Ab (first and second semiconductor devices 1Aa and 1Ab) included in the plurality of types of semiconductor devices 1 will be described, and then an inspection component 220A which is the inspection component 220 of the embodiment will be described. Hereinafter, when the semiconductor devices 1Aa and 1Ab are not distinguished from each other, they are referred to as a semiconductor device 1A. Further, when semiconductor devices 1A, 1B, 1C, and 1D according to a plurality of embodiments which will be described below are not distinguished from each other, they are referred to as the semiconductor device 1. In the following, an example in which the semiconductor device 1 is a semiconductor storage device will be described.

<2. Constitution of Semiconductor Device>

<2.1 Constitution of First Semiconductor Device>

Figure 2:
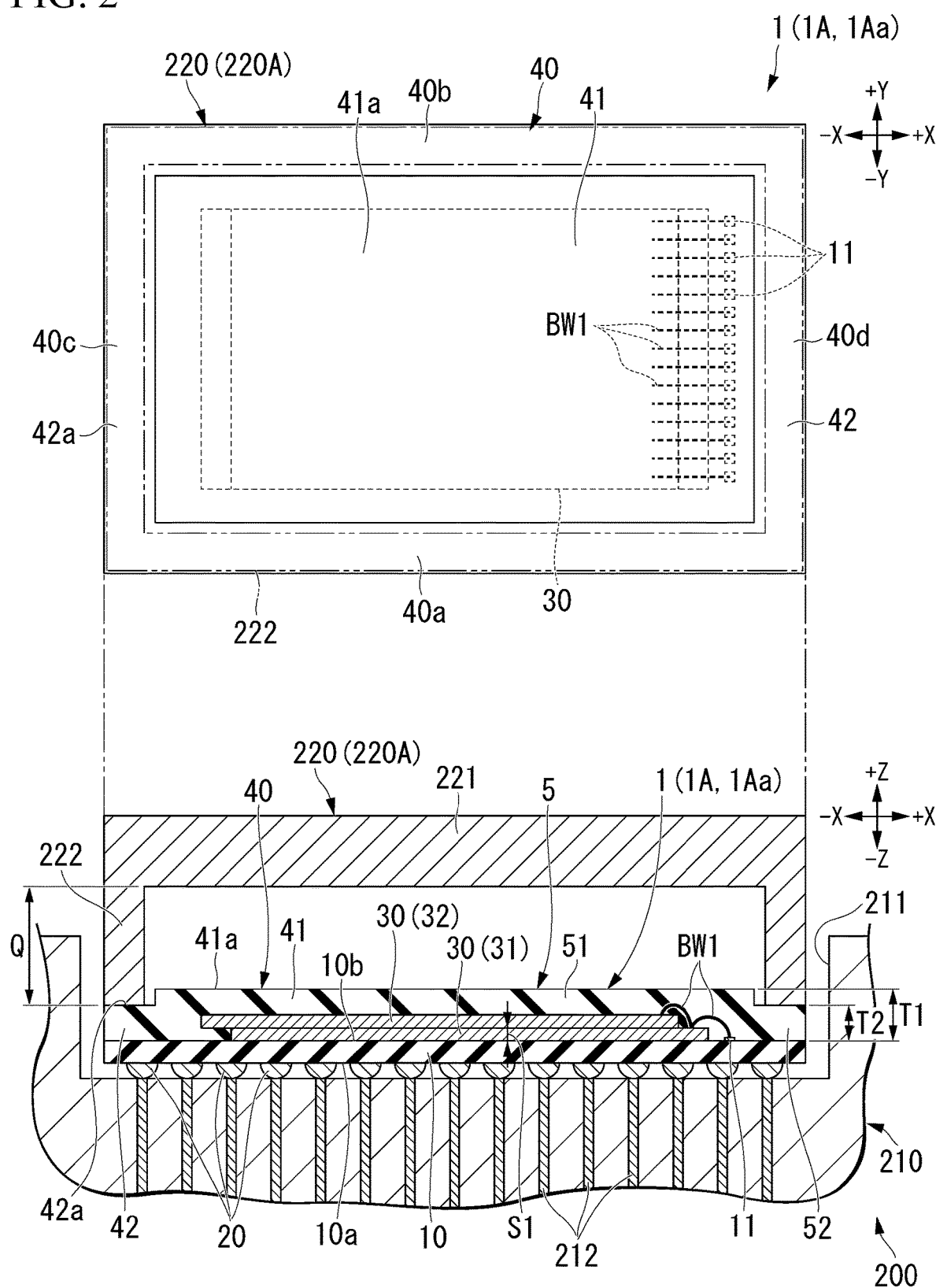
FIG. 2 is a view showing a first semiconductor device and an inspection component according to the first embodiment.

FIG. 2 is a view showing the first semiconductor device 1Aa and the inspection component 220A. First, a constitution common to the first and second semiconductor devices 1Aa and 1Ab will be described. The semiconductor device 1A has, for example, a main body 5 and a plurality of external connection terminals 20. The main body 5 includes, for example, a board 10, a plurality of semiconductor memory chips 30, and a sealing resin portion 40.

The board 10 is formed in a plate shape extending in the X direction and the Y direction. The board 10 is formed in the same rectangular shape as an exterior of the semiconductor device 1 when seen from the +Z direction side (that is, when seen in the Z direction). The board 10 includes an insulating board main body and a wiring pattern provided on the board main body. The board 10 has a first surface 10a and a second surface 10b located on the side opposite to the first surface 10a. The first surface 10a is a surface facing the −Z direction. The first surface 10a includes a plurality of pads (not shown) on which a plurality of external connection terminals 20 are mounted. The second surface 10b is a surface facing the +Z direction. The second surface 10b includes pads 11 to which a plurality of semiconductor memory chips 30 are electrically connected. A thickness of the board 10 of the first semiconductor device 1Aa and a thickness of the board 10 of the second semiconductor device 1Ab are the same as each other.

The external connection terminals 20 are provided on the first surface 10a of the board 10 and are exposed to the outside of the semiconductor device 1. Each of the external connection terminals 20 is an electrical connector to be connected to a metal part (for example, a pad) of a printed wiring board in a case where the semiconductor device 1 is mounted on the external printed wiring board. The external connection terminal 20 may be referred to as an "electrode". For example, the plurality of external connection terminals 20 are arranged in a grid pattern in the X direction and the Y direction. In the embodiment, the plurality of external connection terminals 20 are solder balls of a ball grid array (BGA). However, the external connection terminals 20 are not limited to the above example. The external connection terminal 20 may be a pad to be connected to the outside via a conductive paste, a terminal such as a lead frame or a pin, or a terminal to be connected to the outside in other modes. In the following, it is assumed that an arrangement and a size of the external connection terminals 20 are the same for the plurality of types of semiconductor devices 1.

The plurality of semiconductor memory chips 30 are located on the side of the board 10 opposite to the plurality of external connection terminals 20. Each of the plurality of semiconductor memory chips 30 is formed in a plate shape extending in the X direction and the Y direction. The plurality of semiconductor memory chips 30 are stacked in the Z direction. The semiconductor memory chip 30 is, for example, a non-volatile memory chip and is, for example, a NAND flash memory chip. However, the semiconductor memory chip 30 is not limited to the above example. The semiconductor memory chip 30 may be a resistance-changing memory chip or another type of memory chip. The semiconductor memory chip 30 is an example of a "semiconductor component". However, the "semiconductor component" is not limited to the semiconductor memory chip, and any of various integrated circuit (IC) components is widely applicable.

The sealing resin portion 40 is provided on the second surface 10b of the board 10 and integrally covers the plurality of semiconductor memory chips 30 from the side opposite to the board 10. The sealing resin portion 40 is a so-called mold resin portion and has an insulating property. The sealing resin portion 40 is an example of an "insulator". The sealing resin portion 40 is formed in the same rectangular shape as the exterior of the semiconductor device 1 when seen from the +Z direction side. In the embodiment, the sealing resin portion 40 covers the entire area of the second surface 10b of the board 10.

The sealing resin portion 40 has first to fourth end portions 40a, 40b, 40c, and 40d. The first and second end portions 40a and 40b are end portions extending in the X direction and are spaced apart from each other in the Y direction. The first and second end portions 40a and 40b are end portions extending in a longitudinal direction of the semiconductor device 1. The third and fourth end portions 40c and 40d are end portions extending in the Y direction and are spaced apart from each other in the X direction.

Next, different constitutions of the first and second semiconductor devices 1Aa and 1Ab will be described. The first semiconductor device 1Aa includes, for example, two semiconductor memory chips 30. However, the number of semiconductor memory chips 30 mounted on the first semiconductor device 1Aa may be one or three or more.

In the embodiment, the two semiconductor memory chips 30 include a first semiconductor memory chip 31 and a second semiconductor memory chip 32. The first semiconductor memory chip 31 is mounted on the second surface 10b of the board 10. The second semiconductor memory chip 32 overlaps the first semiconductor memory chip 31 from the side opposite to the board 10. The second semiconductor memory chip 32 is disposed to be displaced in the −X direction with respect to the first semiconductor memory chip 31. The first and second semiconductor memory chips 31 and 32 are electrically connected to the pads 11 on the second surface 10b of the board 10 by bonding wires BW1 provided at end portions of the first and second semiconductor memory chips 31 and 32 in the +X direction.

The sealing resin portion 40 includes a first region 41 and a second region 42. The first region 41 is provided in a central portion of the sealing resin portion 40 when seen from the +Z direction side. The first region 41 is formed in a rectangular shape smaller than the exterior of the sealing resin portion 40. A surface 41a of the first region 41 in the +Z direction is formed in a planar shape extending in the X direction and the Y direction. The first region 41 overlaps the plurality of semiconductor memory chips 31 and 32 and the bonding wires BW1 in the Z direction and integrally covers the plurality of semiconductor memory chips 31 and 32 and the bonding wires BW1. The first region 41 has a thickness T1 with respect to the second surface 10b of the board 10 in the Z direction. The thickness T1 is an example of a "first thickness".

The second region 42 is located on the outer peripheral side of the first region 41 when seen from the +Z direction side. In the embodiment, the second region 42 is provided in a frame shape along four sides of the exterior of the rectangular sealing resin portion 40 when seen from the +Z direction side. That is, the second region 42 is provided at each of the first to fourth ends 40a, 40b, 40c, and 40d of the sealing resin portion 40. A surface 42a of the second region 42 in the +Z direction is formed in a planar shape extending in the X direction and the Y direction. For example, the second region 42 is provided at a position at which it does not overlap the plurality of semiconductor memory chips 31 and 32 in the Z direction. The second region 42 may overlap at least a part of the external connection terminals 20 (for example, the external connection terminals 20 disposed on the outermost circumference) in the Z direction. The second region 42 may overlap at least a part of the bonding wires BW1 and at least a part of the pads 11 in the Z direction. The second region 42 has a thickness T2 with respect to the second surface 10b of the board 10 in the Z direction. The thickness T2 is an example of a "second thickness". The thickness T2 of the second region 42 is thinner than the thickness T1 of the first region 41.

With the above-described constitution, a stepped portion which is lower than the central portion of the sealing resin portion 40 is provided at a peripheral end portion of the sealing resin portion 40. In other words, the semiconductor device 1A includes a first portion 51 and a second portion (an overhanging portion) 52 which is located on the outer peripheral side of the first portion 51 and is thinner than the first portion 51 in the Z direction. The first portion 51 is a portion including the first region 41 of the sealing resin portion 40. The second portion 52 is a portion including the second region 42 of the sealing resin portion 40.

In the embodiment, the thickness T2 of the second region 42 is thicker than a thickness S1 of the semiconductor memory chip 30 (for example, the first semiconductor memory chip 31) in the Z direction. In other words, the surface 42a of the second region 42 is located on the +Z direction side of the first semiconductor memory chip 31.

In the embodiment, a difference between the thickness T1 of the first region 41 and the thickness T2 of the second region 42 is smaller than the thickness T2 of the second region 42. For example, the thickness T2 of the second region 42 is 1.0 mm. The difference between the thickness T1 of the first region 41 and the thickness T2 of the second region 42 is less than 0.5 mm, for example, 0.1 mm to 0.3 mm. For example, the surface 42a of the second region 42 is located on the +Z direction side of the bonding wires BW1 which connect the first semiconductor memory chip 31 to the board 10. On the other hand, the surface 42a of the second region 42 may be located on the −Z direction side (that is, near the board 10) of a part of the bonding wires BW1 connected to the second semiconductor memory chip 32. The first semiconductor memory chip 31 is an example of a "first semiconductor component". The second semiconductor memory chip 32 is an example of a "second semiconductor component".

<2.2 Constitution of Second Semiconductor Device>

Figure 3:
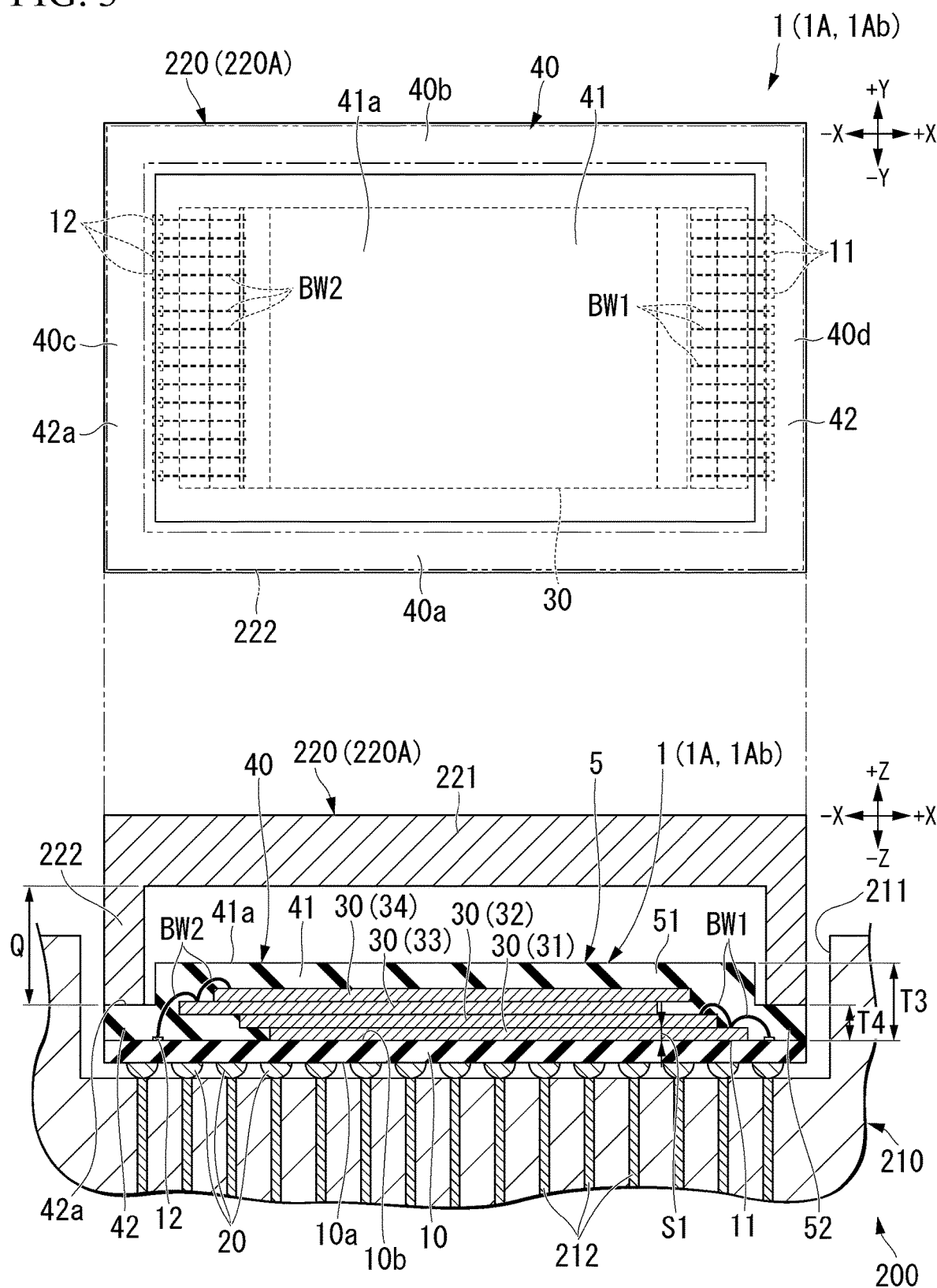
FIG. 3 is a view showing a second semiconductor device and the inspection component according to the first embodiment.

FIG. 3 is a view showing the second semiconductor device 1Ab and the inspection component 220A. The second semiconductor device 1Ab includes, for example, four semiconductor memory chips 30. The number of semiconductor memory chips 30 mounted on the second semiconductor device 1Ab is larger than the number of semiconductor memory chips 30 mounted in the first semiconductor device 1Aa. The second semiconductor device 1Ab has a larger storage capacity than the first semiconductor device 1Aa due to the large number of semiconductor memory chips 30. However, the number of semiconductor memory chips 30 mounted on the second semiconductor device 1Ab may be 3 or less, or 5 or more.

In the embodiment, the four semiconductor memory chips 30 include first to fourth semiconductor memory chips 31, 32, 33, and 34. The first semiconductor memory chip 31 is mounted on the second surface 10b of the board 10. The second semiconductor memory chip 32 overlaps the first semiconductor memory chip 31 from the side opposite to the board 10. The second semiconductor memory chip 32 is disposed to be displaced in the −X direction with respect to the first semiconductor memory chip 31. The first and second semiconductor memory chips 31 and 32 are electrically connected to the pads 11 on the second surface 10b of the board 10 by the bonding wires BW1 provided at end portions of the first and second semiconductor memory chips 31 and 32 in the +X direction.

The third semiconductor memory chip 33 overlaps the second semiconductor memory chip 32 from the side opposite to the board 10. The third semiconductor memory chip 33 is disposed to be displaced in the −X direction with respect to the second semiconductor memory chip 32. The fourth semiconductor memory chip 34 overlaps the third semiconductor memory chip 33 from the side opposite to the board 10.

The fourth semiconductor memory chip 34 is disposed to be displaced in the +X direction with respect to the third semiconductor memory chip 33. The third and fourth semiconductor memory chips 33 and 34 are electrically connected to the pads 12 on the second surface 10b of the board 10 by the bonding wires BW2 provided at the end portions of the third and fourth semiconductor memory chips 33 and 34 in the −X direction.

The sealing resin portion 40 of the second semiconductor device 1Ab includes a first region 41 and a second region 42, similarly to the sealing resin portion 40 of the first semiconductor device 1Aa. The first region 41 and the second region 42 of the second semiconductor device 1Ab have the same shape as the first region 41 and the second region 42 of the first semiconductor device 1Aa when seen from the +Z direction side. The first region 41 of the second semiconductor device 1Ab overlaps the plurality of semiconductor memory chips 31, 32, 33, and 34 and the bonding wires BW1 and BW2 in the Z direction and integrally covers the plurality of semiconductor memory chips 31, 32, 33, and 34 and the bonding wires BW1 and BW2. The first region 41 of the second semiconductor device 1Ab has a thickness T3 with respect to the second surface 10b of the board 10 in the Z direction. The thickness T3 is another example of the "first thickness".

On the other hand, the second region 42 of the second semiconductor device 1Ab is provided at a position at which it does not overlap the plurality of semiconductor memory chips 31, 32, 33, and 34 in the Z direction. The second region 42 of the second semiconductor device 1Ab may overlap at least a part of the external connection terminals 20 (for example, the external connection terminals 20 disposed on the outermost circumference) in the Z direction. The second region 42 of the second semiconductor device 1Ab may overlap at least a part of the bonding wires BW1 and BW2 and at least a part of the pads 11 and 12 in the Z direction. The second region 42 of the second semiconductor device 1Ab has a thickness T4 with respect to the second surface 10b of the board 10 in the Z direction. The thickness T4 is another example of the "second thickness". The thickness T4 of the second region 42 is thinner than the thickness T3 of the first region 41. For example, the surface 42a of the second region 42 is located on the +Z direction side of the bonding wires BW1 which connect the first semiconductor memory chip 31 to the board 10. On the other hand, the surface 42a of the second region 42 may be located on the −Z direction side (that is, near the board 10) of at least a part of the bonding wires BW2 connected to the fourth semiconductor memory chip 34. The fourth semiconductor memory chip 34 is another example of the "second semiconductor component".

In the embodiment, the thickness T3 of the first region 41 of the second semiconductor device 1Ab is thicker than the thickness T1 of the first region 41 of the first semiconductor device 1Aa. The thickness T3 of the first region 41 of the second semiconductor device 1Ab is thicker by the number of semiconductor memory chips 30 of the second semiconductor device 1Ab being larger than the number of semiconductor memory chips 30 of the first semiconductor device 1Aa, for example. On the other hand, the thickness T4 of the second region 42 of the second semiconductor device 1Ab is the same as the thickness T2 of the second region 42 of the first semiconductor device 1Aa. In other words, the thicknesses T2 and T4 of the second region 42 of the semiconductor devices 1Aa and 1Ab are constant thicknesses regardless of the number of semiconductor memory chips 30 mounted therein.

<3. Constitution of Inspection Component>

Next, the inspection component 220A will be described with reference to FIGS. 2 and 3. The inspection component 220A has, for example, a base 221 and a protruding portion 222. The base 221 is mounted on the moving mechanism 230 and supported by the moving mechanism 230. The base 221 is formed in a rectangular shape which covers the first region 41 of the semiconductor device 1A when seen from the +Z direction side. When the semiconductor device 1A is placed on the receiving portion 211 of the inspection device 200, the base 221 faces the first region 41 of the semiconductor device 1A.

The protruding portion 222 is provided to protrude in the −Z direction with respect to the base 221. In the embodiment, the protruding portion 222 is formed in a frame shape corresponding to the second region 42 of the semiconductor device 1A when seen from the +Z direction side. That is, the protruding portion 222 is formed in a frame shape corresponding to the first to fourth end portions 40a, 40b, 40c, and

40d of the sealing resin portion 40 of the semiconductor device 1A. When the semiconductor device 1A is placed on the receiving portion 211 of the inspection device 200, the protruding portion 222 faces the second region 42 of the semiconductor device 1A. The protruding portion 222 comes into contact with the second region 42 of the semiconductor device 1A and presses the second region 42 of the semiconductor device 1A toward the receiving portion 211 of the inspection device 200 by the inspection component 220A moving downward due to the moving mechanism 230 during the inspection of the semiconductor device 1A. The protruding portion 222 is an example of a "pressing portion".

Here, an amount Q of protrusion of the protruding portion 222 with respect to the base 221 is larger than a difference between the thickness T1 of the first region 41 and the thickness T2 of the second region 42 of the first semiconductor device 1Aa. Further, the amount Q of protrusion of the protruding portion 222 with respect to the base 221 is larger than a difference between the thickness T3 of the first region 41 and the thickness T4 of the second region 42 of the second semiconductor device 1Ab. Thus, the protruding portion 222 can come into contact with the second region 42 of the semiconductor device 1A and can press the second region 42 of the semiconductor device 1A toward the receiving portion 211 of the inspection device 200 in a state in which the inspection component 220A is spaced apart from the first region 41 of the semiconductor device 1A.

<4. Action>

In summary, the following can be said. For example, when an arrangement of the external connection terminals 20 is uniform, it is desired to use a common inspection component regardless of the thickness of the semiconductor device 1. However, for example, in the case of an inspection device in which it is difficult to move the inspection component to an arbitrary height position, it is necessary to replace the inspection component according to the thickness of the semiconductor device 1. In this case, it is necessary to prepare a plurality of inspection components according to the type of the semiconductor device 1, and thus the cost related to the inspection is increased.

Therefore, in the embodiment, the semiconductor device 1A includes the sealing resin portion 40 having the first region 41 having the first thicknesses T1 and T3 and the second region 42 having the second thicknesses T2 and T4 thinner than the first thicknesses T1 and T3. With such a constitution, it is possible to inspect the plurality of types of semiconductor devices 1Aa and 1Ab having different thicknesses using one inspection component 220 (for example, the inspection component 220A) by providing the second region 42 having a thickness independent of the type of the semiconductor device 1. Thus, it is possible to reduce the cost related to the inspection. The inspection component 220 can be commonly used, for example, for a third semiconductor device equipped with eight semiconductor memory chips 30 and a fourth semiconductor device equipped with 16 semiconductor memory chips 30, in addition to the above-described two types of semiconductor devices 1Aa and 1Ab.

In addition, with such a constitution, not only can a purchase cost of the inspection component 220 be reduced, but also various costs such as labor costs may also be reduced by reducing the number of times of replacement of equipment components during the inspection, and inspection efficiency may be improved by reducing equipment downtime. For example, when a low temperature inspection is performed, it is necessary to replace equipment components after a high temperature drying time to prevent dew condensation. Therefore, if the number of times of replacement of the inspection component 220 may be reduced when the low temperature inspection is performed, further improvement in the inspection efficiency may be expected.

In the embodiment, the second region 42 is provided at a position at which it does not overlap the semiconductor memory chip 30 in the 7 direction. With such a constitution, the thicknesses T2 and T4 of the second region 42 can be set regardless of the number of semiconductor memory chips 30.

In the embodiment, the second thicknesses T2 and T4 are thicker than the thickness S1 of the semiconductor memory chip 30 in the Z direction. With such a constitution, for example, the semiconductor device 1 in which the entire sealing resin portion 40 has the thickness T2 can be adopted as the thinnest semiconductor device 1 included in the plurality of types of semiconductor devices 1 for which the inspection component 220 is used. Such a semiconductor device 1 is, for example, a semiconductor device having only one semiconductor memory chip 30. Even in such a semiconductor device 1, since the entire sealing resin portion 40 has the thickness T2, the inspection can be performed using the inspection component 220 common to the semiconductor devices 1Aa and 1Ab.

In the embodiment, the second region 42 of the sealing resin portion 40 is provided in a frame shape along the four sides of the exterior of the sealing resin portion 40. With such a constitution, the semiconductor device 1A can be pressed by the inspection component 220A having the frame-shaped protruding portion 222. According to the frame-shaped protruding portion 222, since the entire semiconductor device 1A can be pressed stably, the inspection accuracy may be further improved.

Next, some modified examples of the first embodiment will be described. The constitution other than that described below in each of the modified examples is the same as the constitution of the first embodiment. A plurality of modified examples which will be described below may be realized in combination with each other.

First Modified Example

Figure 4:
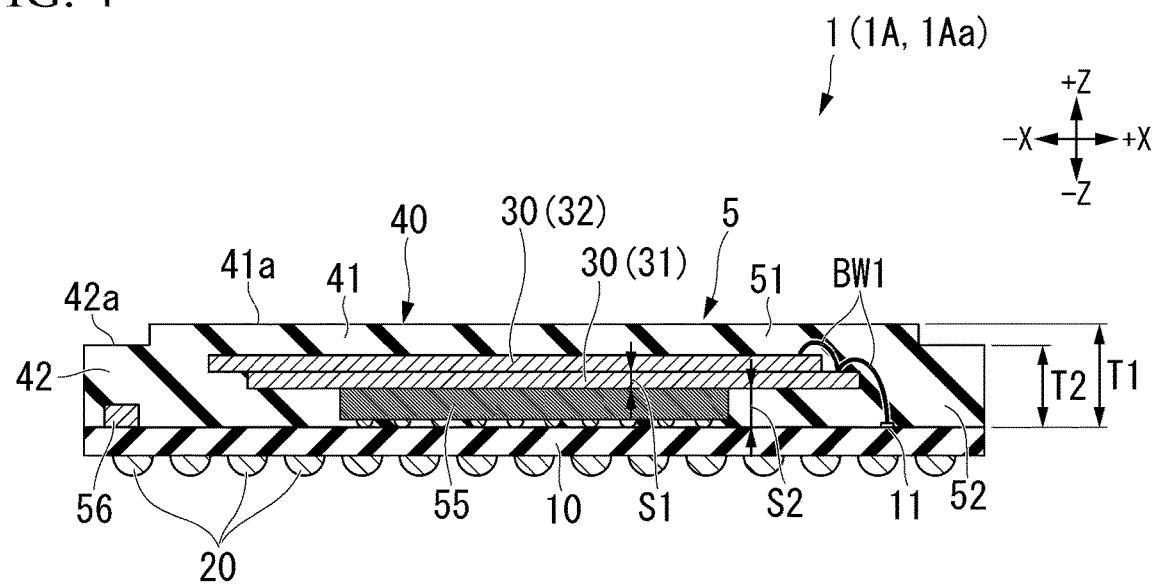
FIG. 4 is a cross-sectional view showing a semiconductor device according to a first modified example of the first embodiment.

FIG. 4 is a cross-sectional view showing a semiconductor device 1A (for example, the first semiconductor device 1Aa) according to a first modified example. In the first modified example, the semiconductor device 1A has a controller chip 55 and electronic components 56 in addition to the constitution of the first embodiment.

The controller chip 55 is an electronic component which controls a plurality of semiconductor memory chips 30. The controller chip 55 communicates with one or more semiconductor memory chips 30 on the basis of an external command (for example, a read command, a write command, or an erase command) to the semiconductor device 1 and performs a processing requested by the above command. The controller chip 55 is constituted of, for example, a system on a chip (SoC). The controller chip 55 includes, for example, a host interface connected to the outside via the plurality of external connection terminals 20, a memory interface connected to the plurality of semiconductor memory chips 30 via the bonding wires BW1 or the like, a central processing unit (CPU), an internal memory, and the like. The internal memory is, for example, a static random access memory (SRAM). The controller chip 55 is an example of the "controller component".

The controller chip 55 is disposed between the board 10 and the first semiconductor memory chip 31. For example, the controller chip 55 is provided on the second surface 10b of the board 10. The plurality of semiconductor memory chips 30 are stacked on the controller chip 55. For example, a thickness S2 of the controller chip 55 in the Z direction is thicker than a thickness of the semiconductor memory chip 30.

The electronic components 56 are provided on the second surface 10b of the board 10. The electronic component 56 is, for example, a resistor component, a capacitor component, or one of various IC components, but is not limited thereto. The electronic component 56 is, for example, a component which can be commonly used regardless of the number of semiconductor memory chips 30.

The first region 41 of the sealing resin portion 40 overlaps the controller chip 55, the plurality of semiconductor memory chips 30, and the bonding wires BW1 in the Z direction and covers the controller chip 55, the plurality of semiconductor memory chips 30, and the bonding wires BW1 from the side opposite to the board 10.

The second region 42 of the sealing resin portion 40 is provided at a position at which it does not overlap the controller chip 55 and the plurality of semiconductor memory chips 30 in the Z direction. The second region 42 of the sealing resin portion 40 overlaps the electronic components 56 and covers the electronic components 56 from the side opposite to the board 10. The thickness T2 of the second region 42 is thicker than a sum of the thickness S2 of the controller chip 55 in the Z direction and the thickness S1 of the first semiconductor memory chip 31 in the Z direction.

In the second semiconductor device 1Ab according to the first modified example, the third and fourth memory chips 33 and 34 are provided for the constitution of the first above-described semiconductor device 1Aa according to the first modified example, as in the first embodiment. With such a constitution, even in the semiconductor device 1 in which the semiconductor memory chip 30 and the controller chip 55 are stacked, it is possible to reduce the cost related to the inspection as in the first embodiment. In the embodiment, the electronic components 56 are mounted using the second region 42. With such a constitution, even when the second region 42 is provided in the semiconductor device 1, the semiconductor device 1 may be miniaturized.

Second Modified Example

Figure 5:
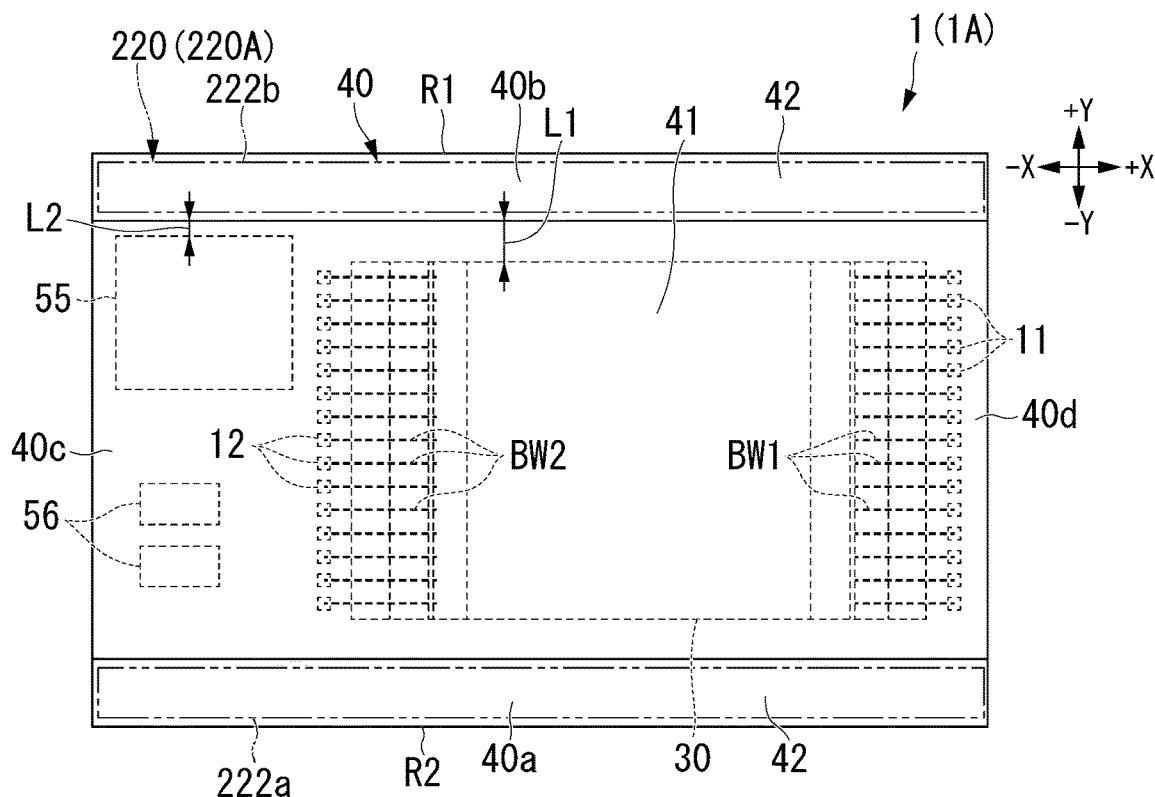
FIG. 5 is a cross-sectional view showing a semiconductor device according to a second modified example of the first embodiment.

FIG. 5 is a plan view showing a semiconductor device 1A according to a second modified example. In the second modified example, in the semiconductor device 1A, a position of the second region 42 of the sealing resin portion 40 is different from that in the constitution of the first embodiment.

In the second modified example, a longitudinal direction of the semiconductor memory chip 30 coincides with a longitudinal direction of the semiconductor device 1A (a longitudinal direction of the sealing resin portion 40, the X direction). The bonding wires BW1 and BW2 are connected to both end portions of the semiconductor memory chip 30 in the X direction. On the other hand, the bonding wires are not connected to both end portions of the semiconductor memory chip 30 in the Y direction.

In the second modified example, the second region 42 of the sealing resin portion 40 is provided along each of two sides R1 and R2 (that is, the first and second end portions 40a and 40b of the sealing resin portion 40) spaced apart from each other and included in the exterior of the rectangular sealing resin portion 40, when seen from the +Z direction side. The two sides R1 and R2 are sides extending in the longitudinal direction of the sealing resin portion 40. On the other hand, the second region 42 is not provided in the third and fourth end portions 40c and 40d of the sealing resin portion 40. The first region 41 is provided in the third and fourth end portions 40c and 40d of the sealing resin portion 40. In other words, the second region 42 of the sealing resin portion 40 is provided only at the end portions 40a and 40b, among the end portions of the sealing resin portion 40, which are not adjacent to the plurality of bonding wires BW1 and BW2. In the second modified example, all the bonding wires BW1 and BW2 are covered with the first region 41 of the sealing resin portion 40. With such a constitution, the thicknesses T2 and T4 of the second region 42 of the sealing resin portion 40 can be set to be low regardless of heights of the bonding wires BW1 and BW2. Thus, the semiconductor device 1A may be made thinner.

In the second modified example, the controller chip 55 and the electronic component 56 do not overlap the semiconductor memory chip 30 in the Z direction and are located on the −X direction side with respect to the semiconductor memory chip 30. The controller chip 55 and the electronic component 56 are provided on the second surface 10b of the board 10. The controller chip 55 and the electronic component 56 are covered with the first region 41 of the sealing resin portion 40. In the second modified example, when seen from the +Z direction side, a shortest distance L2 between the controller chip 55 and the second region 42 of the sealing resin portion 40 is shorter than a shortest distance L1 between the semiconductor memory chip 30 and the second region 42 of the sealing resin portion 40.

In the second modified example, the inspection component 220A has a base 221 and a pair of protruding portions 222a and 222b. The protruding portions 222a and 222b protrude from the base 221 as in the protruding portion 222 of the first embodiment. The protruding portions 222a and 222b are provided at positions corresponding to the second regions 42 of the semiconductor device 1A when seen from the +Z direction side. That is, the pair of protruding portions 222a and 222b are provided at both end portions of the base 221 in the Y direction. On the other hand, the protruding portions 222a and 222b are not provided at both end portions of the base 221 in the X direction. The protruding portions 222a and 222b face the second region 42 of the semiconductor device 1A when the semiconductor device 1A is placed on the receiving portion 211 of the inspection device 200.

With such a constitution, as in the first embodiment, the cost related to the inspection may be reduced. For example, in the modified example, the second region 42 of the sealing resin portion 40 is provided along the two sides R1 and R2 of the exterior of the sealing resin portion 40 which are spaced apart from each other. With such a constitution, both end portions of the sealing resin portion 40 can be pressed by the inspection component 220A, and the semiconductor device 1A can be supported stably. In the embodiment, the second region 42 of the sealing resin portion 40 is provided along the two sides R1 and R2 of the sealing resin portion 40 extending in the longitudinal direction. Thus, the semiconductor device 1A may be supported stably.

Here, the second region 42 of the sealing resin portion 40 is thinner than the first region 41. Further, a boundary portion between the first region 41 and the second region 42 has a step and has a relatively large surface area exposed to the outside. Therefore, a vicinity of the second region 42 has better heat dissipation than the first region 41. In the embodiment, the controller chip 55 generates a larger amount of heat than the semiconductor memory chip 30. When seen from the +Z direction side, the shortest distance L2 between the controller chip 55 and the second region 42 of the sealing resin portion 40 is shorter than the shortest distance L1 between the semiconductor memory chip 30 and the second region 42 of the sealing resin portion 40. With such a constitution, the heat generated by the controller chip 55 may be efficiently dissipated to the outside through the second region 42. Thus, an operating speed and a lifespan of the semiconductor device 1A may be improved.

(Third Modified Example)

Figure 6:
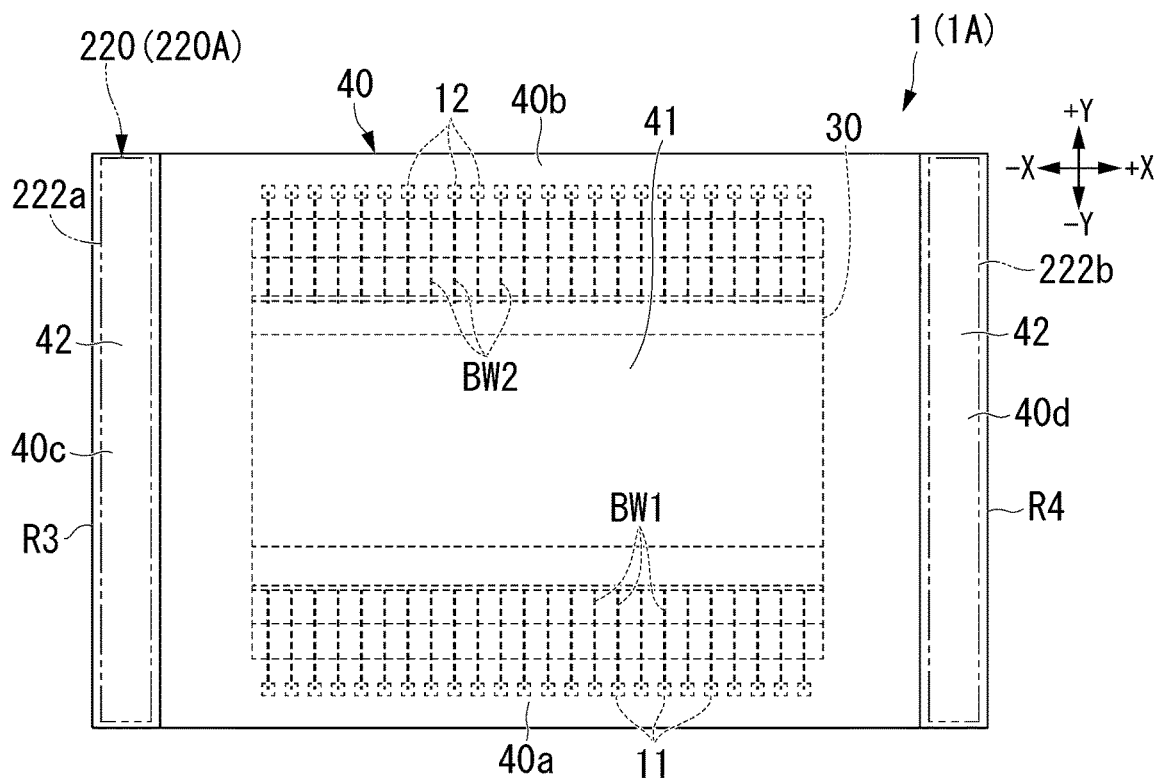
FIG. 6 is a cross-sectional view showing a semiconductor device according to a third modified example of the first embodiment.

FIG. 6 is a plan view showing a semiconductor device 1A according to a third modified example. In the third modified example, a position of the second region 42 of the semiconductor device 1A is different from that in the constitution of the first embodiment.

In the third modified example, the longitudinal direction of the semiconductor memory chip 30 coincides with the longitudinal direction of the semiconductor device A1 (the longitudinal direction of the sealing resin portion 40, the X direction). In the third modified example, the bonding wires BW1 and BW2 are connected to both end portions of the semiconductor memory chip 30 in the Y direction. On the other hand, the bonding wires are not connected to both end portions of the semiconductor memory chip 30 in the X direction. With such a constitution, the number of bonding wires BW1 and BW2 can be increased as compared with the second modified example.

In the third modified example, the second region 42 of the sealing resin portion 40 is provided along each of the two sides R3 and R4 (that is, the third and fourth end portions 40c and 40d of the sealing resin portion 40) spaced apart from each other and included in the exterior of the rectangular sealing resin portion 40 when seen from the +Z direction side. The two sides R3 and R4 are sides orthogonal to the longitudinal direction of the sealing resin portion 40. On the other hand, the second region 42 is not provided at the first and second end portions 40a and 40b of the sealing resin portion 40. A first region 41 is provided at the first and second end portions 40a and 40b of the sealing resin portion 40. In other words, the second region 42 of the sealing resin portion 40 is provided only at the end portions 40c and 40d, among the end portions of the sealing resin portion 40, which are not adjacent to the plurality of bonding wires BW1 and BW2. In the third modified example, all the bonding wires BW1 and BW2 are covered with the first region 41 of the sealing resin portion 40. With such a constitution, the thicknesses T2 and T4 of the second region 42 of the sealing resin portion 40 can be set to be low regardless of the heights of the bonding wires BW1 and BW2. Thus, the semiconductor device 1A may be made thinner.

With such a constitution, as in the first embodiment, the cost related to the inspection may be reduced. With such a constitution of the modified example, both end portions of the sealing resin portion 40 can be pressed by the inspection component 220A, and the semiconductor device 1A may be supported stably. With such a constitution of the modified example, for example, since the second region 42 is smaller than that in the second modified example, a large mounting area inside the semiconductor device 1A may be secured.

Fourth Modified Example

Figure 7:
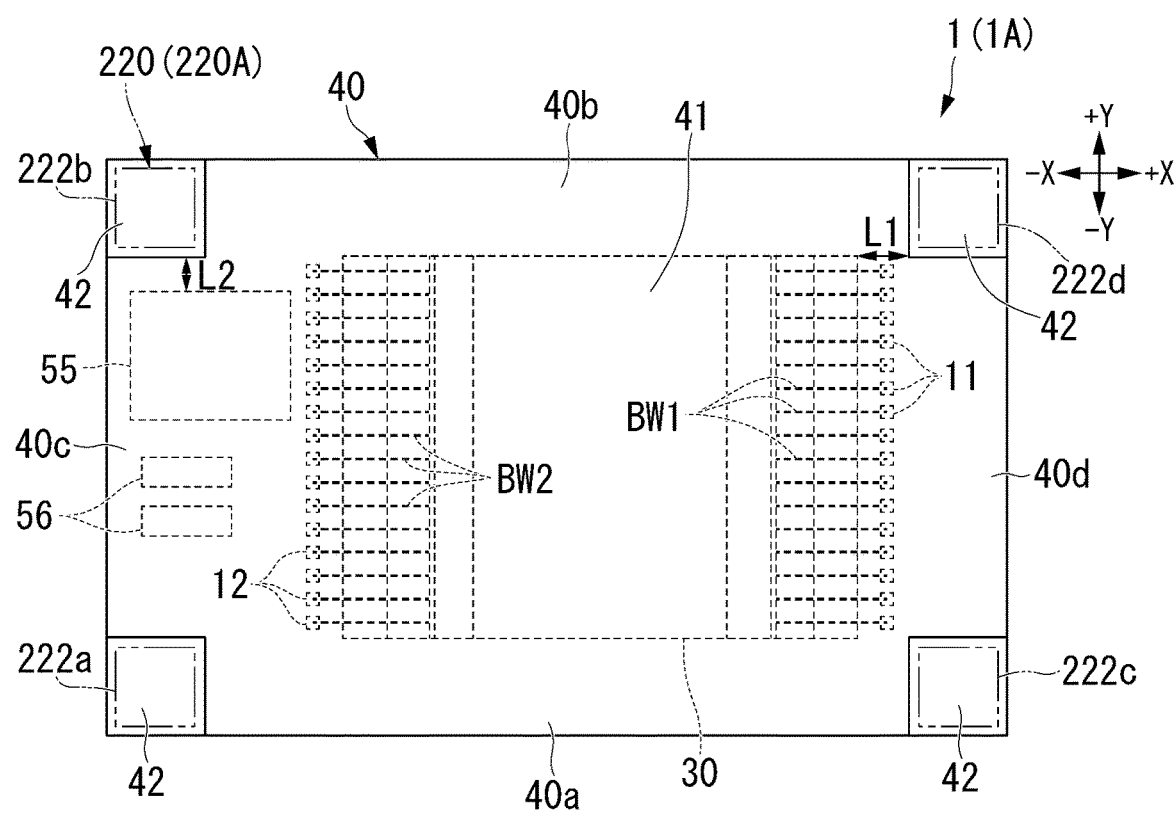
FIG. 7 is a cross-sectional view showing a semiconductor device according to a fourth modified example of the first embodiment.

FIG. 7 is a plan view showing a semiconductor device 1A according to a fourth modified example. In the fourth modified example, the position of the second region 42 of the semiconductor device 1A is different from that in the constitution of the first embodiment.

In the semiconductor device 1A of the fourth modified example, the second region 42 of the sealing resin portion 40 is provided at four corner portions of the exterior of the sealing resin portion 40 when seen from the +Z direction side. The inspection component 220A includes a base 221 and four protruding portions 222a, 222b, 222c, and 222d. The four protruding portions 222a, 222b, 222c, and 222d protrude from the base 221 as in the protruding portion 222 of the first embodiment. The four protruding portions 222a, 222b, 222c, and 222d are provided at positions corresponding to the second regions 42 of the semiconductor device 1A when seen from the +Z direction side. That is, the four protruding portions 222a, 222b, 222c, and 222d are provided at the four corner portions of the base 221 of the inspection component 220A.

With such a constitution, as in the first embodiment, the cost related to the inspection may be reduced. With such a constitution of the modified example, the semiconductor device 1A may be stably pressed during the inspection, and a large mounting area inside the semiconductor device 1A may be secured.

Fifth Modified Example

Figure 8:
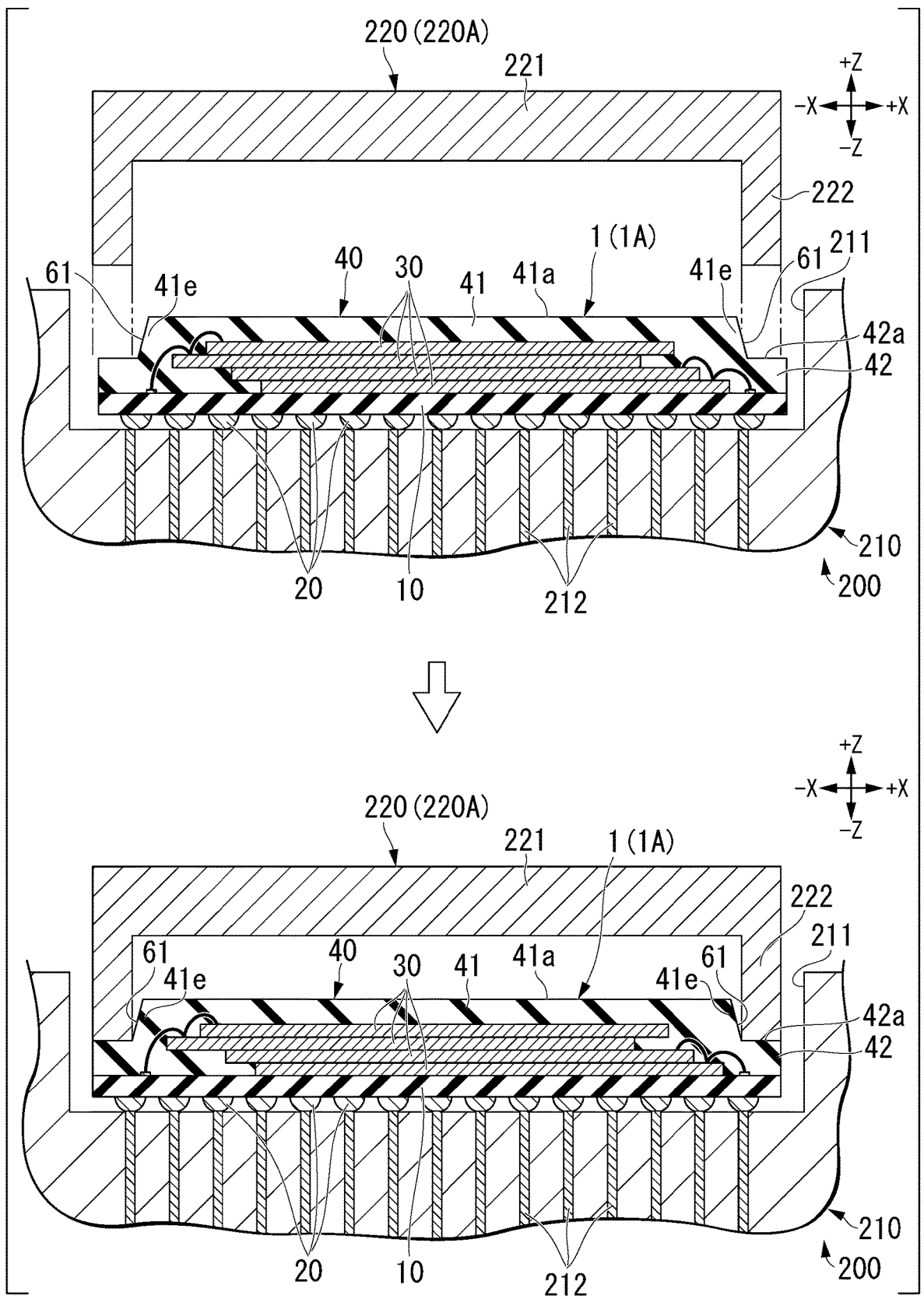
FIG. 8 is a cross-sectional view showing a semiconductor device and an inspection component according to a fifth modified example of the first embodiment.

FIG. 8 is a cross-sectional view showing a semiconductor device 1A according to a fifth modified example. An upper portion in FIG. 8 shows a state in which the semiconductor device 1A is displaced with respect to the inspection component 220A. A lower portion in FIG. 8 shows a state in which the displacement of the semiconductor device 1A is corrected with respect to the inspection component 220A.

In the fifth modified example, the first region 41 of the sealing resin portion 40 has end portions 41e adjacent to the second region 42. An inclined portion 61 for correcting the displacement of the semiconductor device 1A is provided at the end portion 41e. The inclined portion 61 is inclined to become lower as it goes from the first region 41 to the second region 42. The inclined portion 61 is provided, for example, at the end portions 41e (the end portion in the +X direction, the end portion in the −X direction, the end portion in the +Y direction, and the end portion in the −Y direction) on the entire circumference of the first region 41. In other words, the inclined portion 61 inclines so as to be located outside the semiconductor device 1A as a position in the inclined portion 61 is closer to the board 10.

In the fifth modified example, when the inspection component 220A is moved toward the semiconductor device 1A in a state in which the semiconductor device 1A is displaced with respect to the inspection component 220A, the protruding portion 222 of the inspection component 220A comes into contact with the inclined portion 61 of the sealing resin portion 40. When the inspection component 220A is further moved in the −Z direction in this state, the sealing resin portion 40 is laterally displaced with respect to the protruding portion 222 of the inspection component 220A so that the sealing resin portion 40 escapes, and the position displacement of the semiconductor device 1A is corrected.

With such a constitution, as in the first embodiment, the cost related to the inspection may be reduced. With such a constitution of the modified example, even when the position displacement of the semiconductor device 1A occurs, the position displacement of the semiconductor device 1A is corrected. Thus, further improvement in the inspection efficiency may be expected.

Sixth Modified Example

Figure 9:
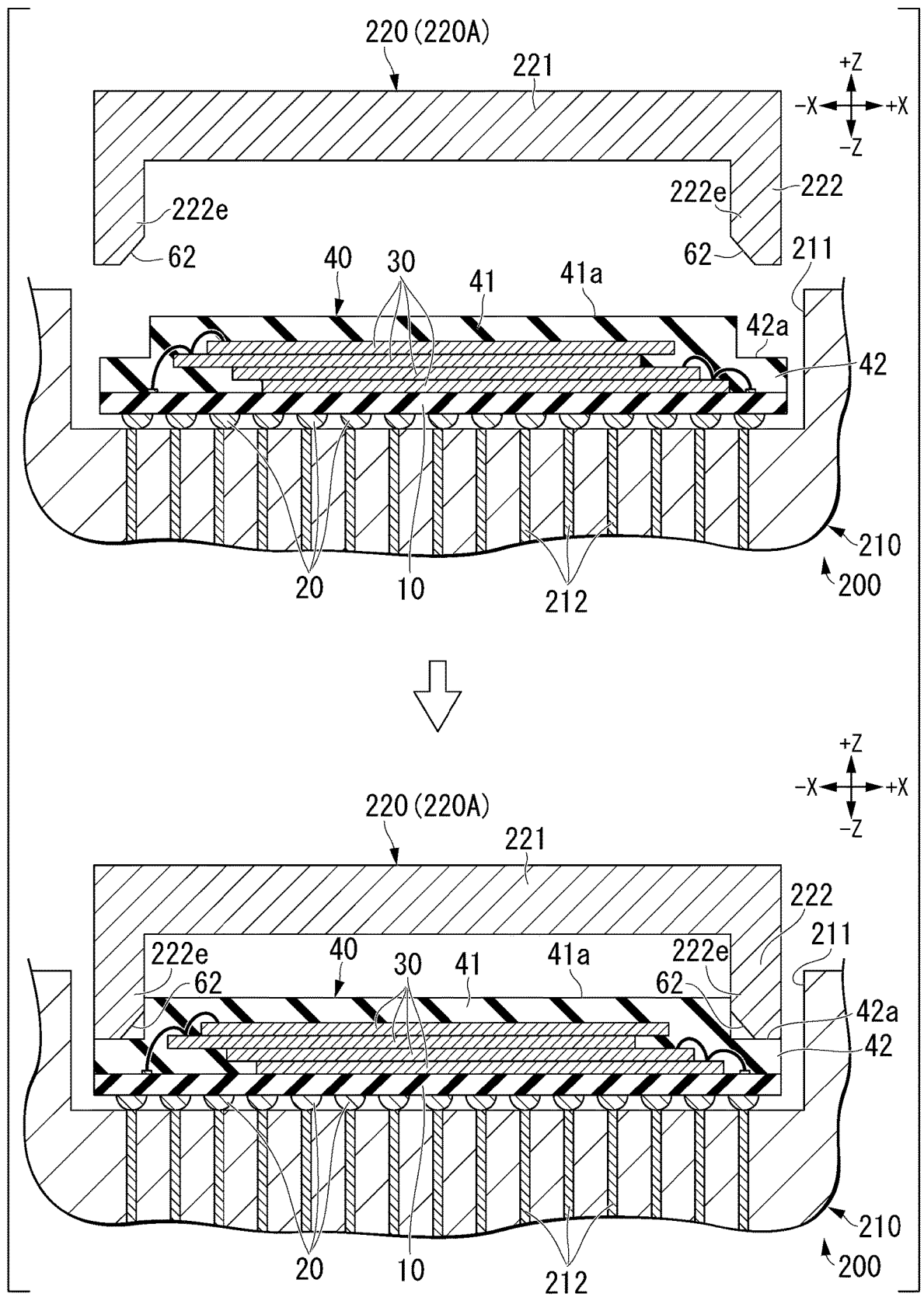
FIG. 9 is a cross-sectional view showing a semiconductor device and an inspection component according to a sixth modified example of the first embodiment.

FIG. 9 is a cross-sectional view showing a semiconductor device 1A according to a sixth modified example. An upper portion in FIG. 9 shows a state in which the semiconductor device 1A is displaced with respect to the inspection component 200A. A lower portion in FIG. 9 shows a state in which the displacement of the semiconductor device 1A is corrected with respect to the inspection component 220A.

In the sixth modified example, the protruding portion 222 of the inspection component 220A has end portions 222e which face inward of the inspection component in the X direction or the Y direction. An inclined portion 62 for correcting the displacement of the semiconductor device 1A is provided at the end portion 222e. The inclined portion 62 is inclined to be located further in the +Z direction as it goes toward the inside of the inspection component 220A in the X direction or the Y direction. The inclined portion 62 is provided, for example, at the end portions 222e (the end portion in the +X direction, the end portion in the −X direction, the end portion in the +Y direction, and the end portion in the −Y direction) on the entire circumference of the protruding portion 222.

In the sixth modified example, as in the fifth modified example, when the inspection component 220A is moved toward the semiconductor device 1A in a state in which the semiconductor device 1A is displaced with respect to the inspection component 220A, the inclined portion 62 of the protruding portion 222 of the inspection component 220A comes into contact with the surface 41a of the first region 41 of the sealing resin portion 40. When the inspection component 220A is further moved in the −Z direction in this state, the sealing resin portion 40 is laterally displaced with respect to the protruding portion 222 of the inspection component 220A so that the sealing resin portion 40 escapes, and the position displacement of the semiconductor device 1A is corrected.

With such a constitution, as in the first embodiment, the cost related to the inspection may be reduced. With such a constitution of this modified example, even when the position displacement of the semiconductor device 1A occurs, the position displacement of the semiconductor device 1A is corrected. Thus, further improvement in the inspection efficiency may be expected.

Seventh Modified Example

Figure 10:
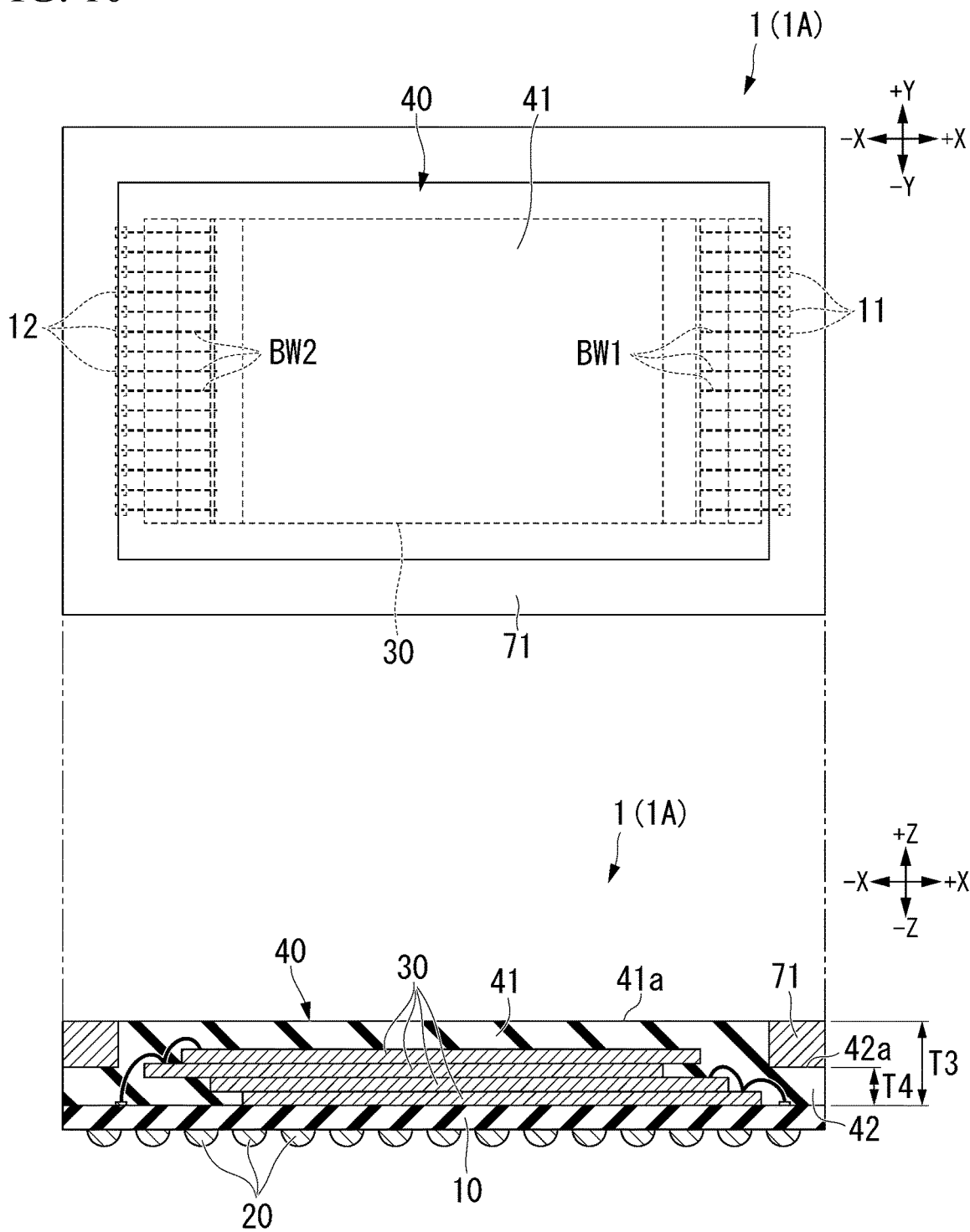
FIG. 10 is a view showing a semiconductor device according to a seventh modified example of the first embodiment.

FIG. 10 is a view showing a semiconductor device 1A according to a seventh modified example. In the seventh modified example, the semiconductor device 1A includes a metal component 71 for heat dissipation. The metal component 71 overlaps the second region 42 of the sealing resin portion 40 from the side opposite to the board 10 and is mounted on the surface 42a of the second region 42 by adhesion or the like. A thickness of the metal component 71 in the Z direction is the same as a difference between the thickness T3 of the first region 41 and the thickness T4 of the second region 42 of the sealing resin portion 40 (or a difference between the thickness T1 and the thickness T2). Shapes of the metal component 71 in the X direction and the Y direction are the same as the shapes of the second region 42 of the sealing resin portion 40 in the X direction and the Y direction.

With such a constitution, as in the first embodiment, the cost related to the inspection may be reduced. With such a constitution of the modified example, the metal component 71 for heat dissipation is provided using a step between the first region 41 and the second region 42. With such a constitution, it is possible to improve the heat dissipation of the semiconductor device 1A while an increase in the thickness of the semiconductor device 1A is curbed.

Second Embodiment

Next, a second embodiment will be described with reference to FIGS. 11 to 14. The second embodiment is different from the first embodiment in that the inspection component 220 can be used for the plurality of types of semiconductor devices 1 by rotating the inspection component 220. In the second embodiment, the constitution other than that described below is the same as the constitution of the first embodiment.

Figure 11:
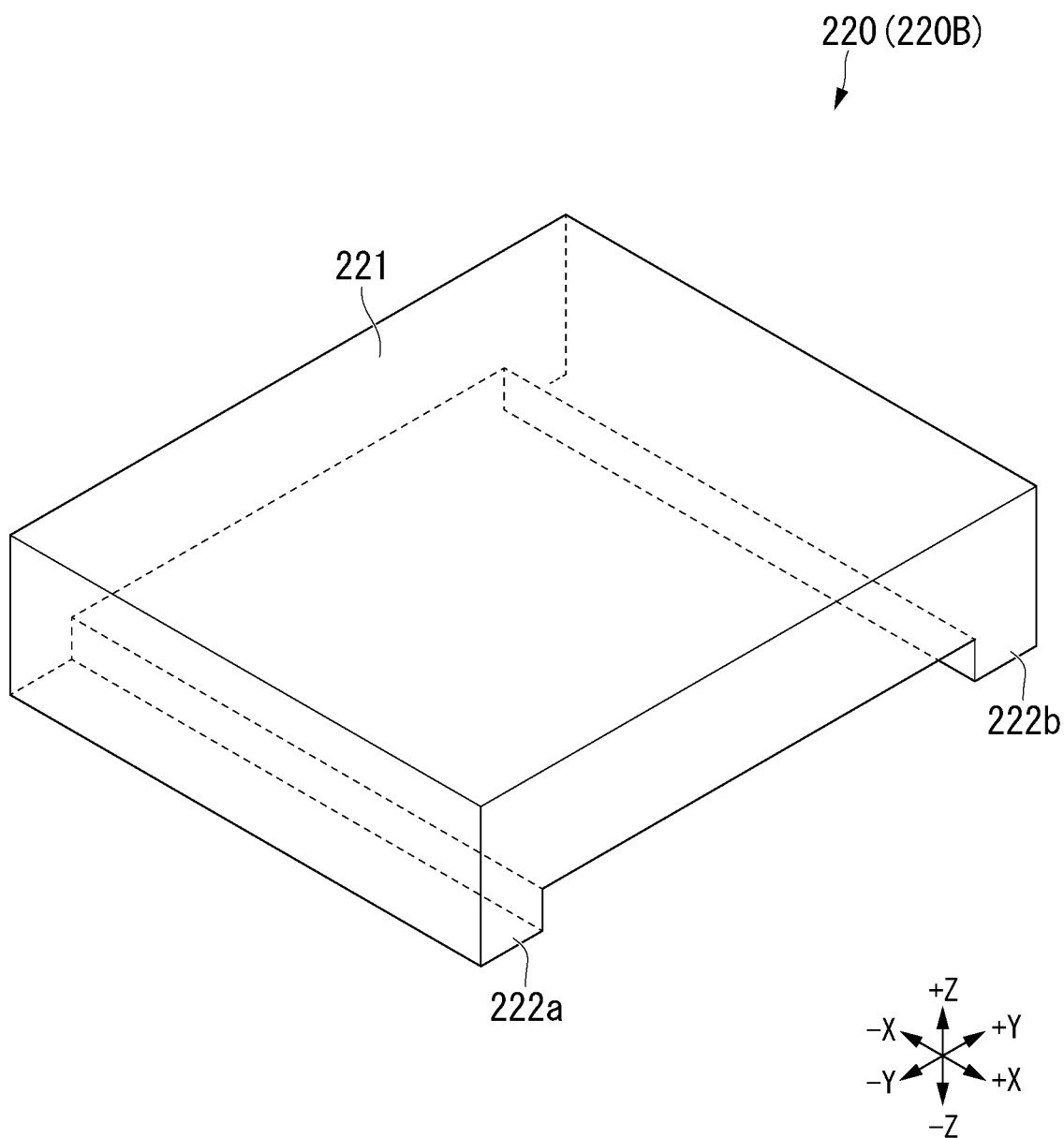
FIG. 11 is a perspective view showing an inspection component according to a second embodiment.

FIG. 11 is a perspective view showing an inspection component 220B of the second embodiment. The inspection component 220B of the embodiment is a pusher which presses the semiconductor device 1 toward the receiving portion 211 of the inspection device 200, like the inspection component 220A of the first embodiment. The inspection component 220B has, for example, a base 221 and a pair of protruding portions 222a and 222b. The protruding portions 222a and 222b protrude from the base 221 in the −Z direction, like the protruding portions 222 of the first embodiment. The inspection component 220B can be used for two types of semiconductor devices 1 having different thicknesses from each other.

In the following, two types of semiconductor devices 1Ba and 1Bb (first and second semiconductor devices 1Ba and 1Bb) for which the inspection component 220B can be used will be described, and then the details of the inspection component 220B according to the embodiment which is the inspection component 220 will be described. Hereinafter, when the semiconductor devices 1Ba and 1Bb are not distinguished from each other, they are referred to as a semiconductor device 1B.

Figure 12:
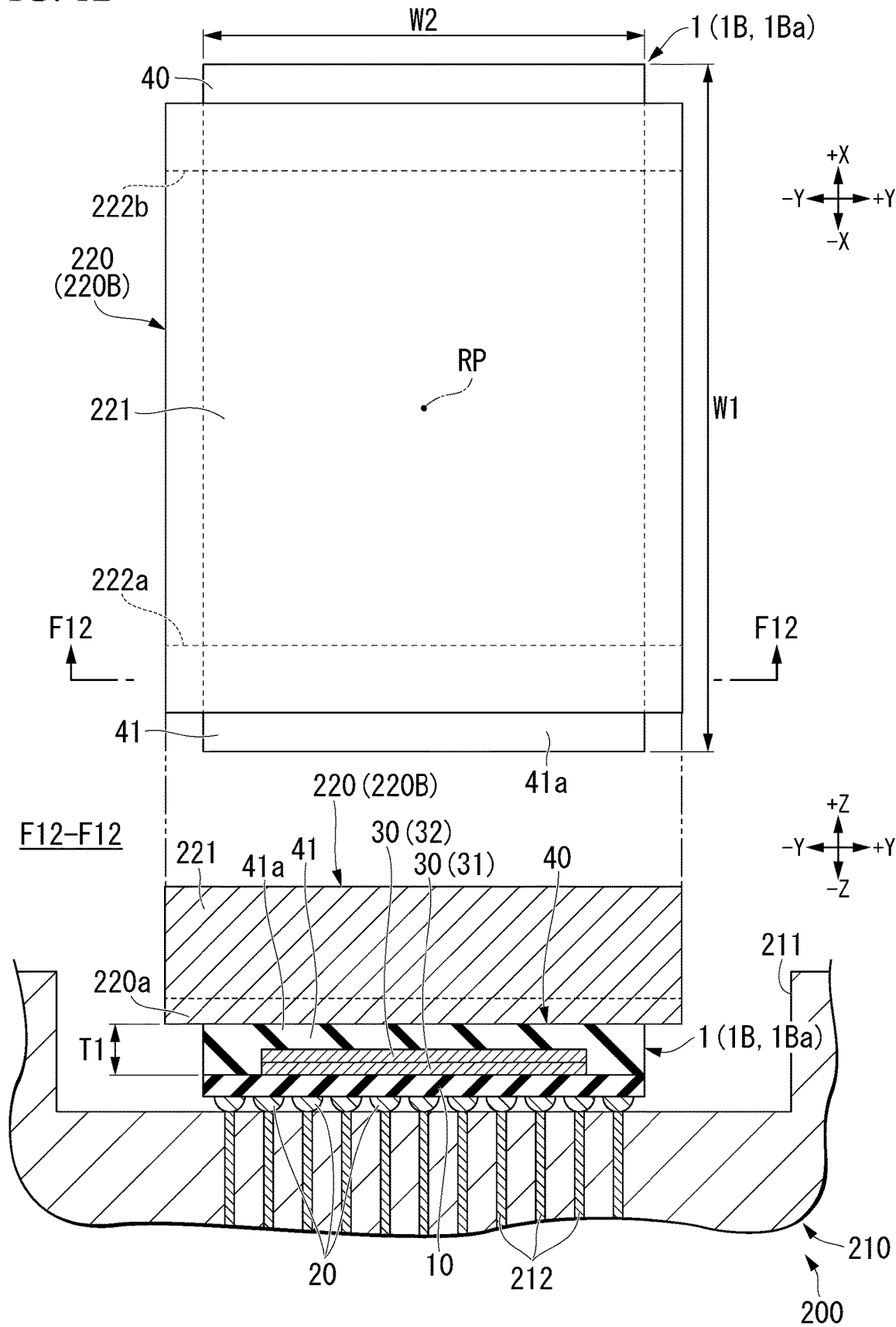
FIG. 12 is a view showing a first semiconductor device and the inspection component according to the second embodiment.

FIG. 12 is a view showing the first semiconductor device 1Ba and the inspection component 220B. The first semiconductor device 1Ba includes a board 10, a plurality of external connection terminals 20, one or more semiconductor memory chips 30, and a sealing resin portion 40. The sealing resin portion 40 of the first semiconductor device 1Ba does not have the second region 42. The sealing resin portion 40 has a thickness T1 with respect to the second surface 10b of the board 10. The first semiconductor device 1Ba (for example, the sealing resin portion 40) has a first width W1 in the X direction. The first semiconductor device 1Ba (for example, the sealing resin portion 40) has a second width W2 in the Y direction. The second width W2 is smaller than the first width W1.

Figure 13:
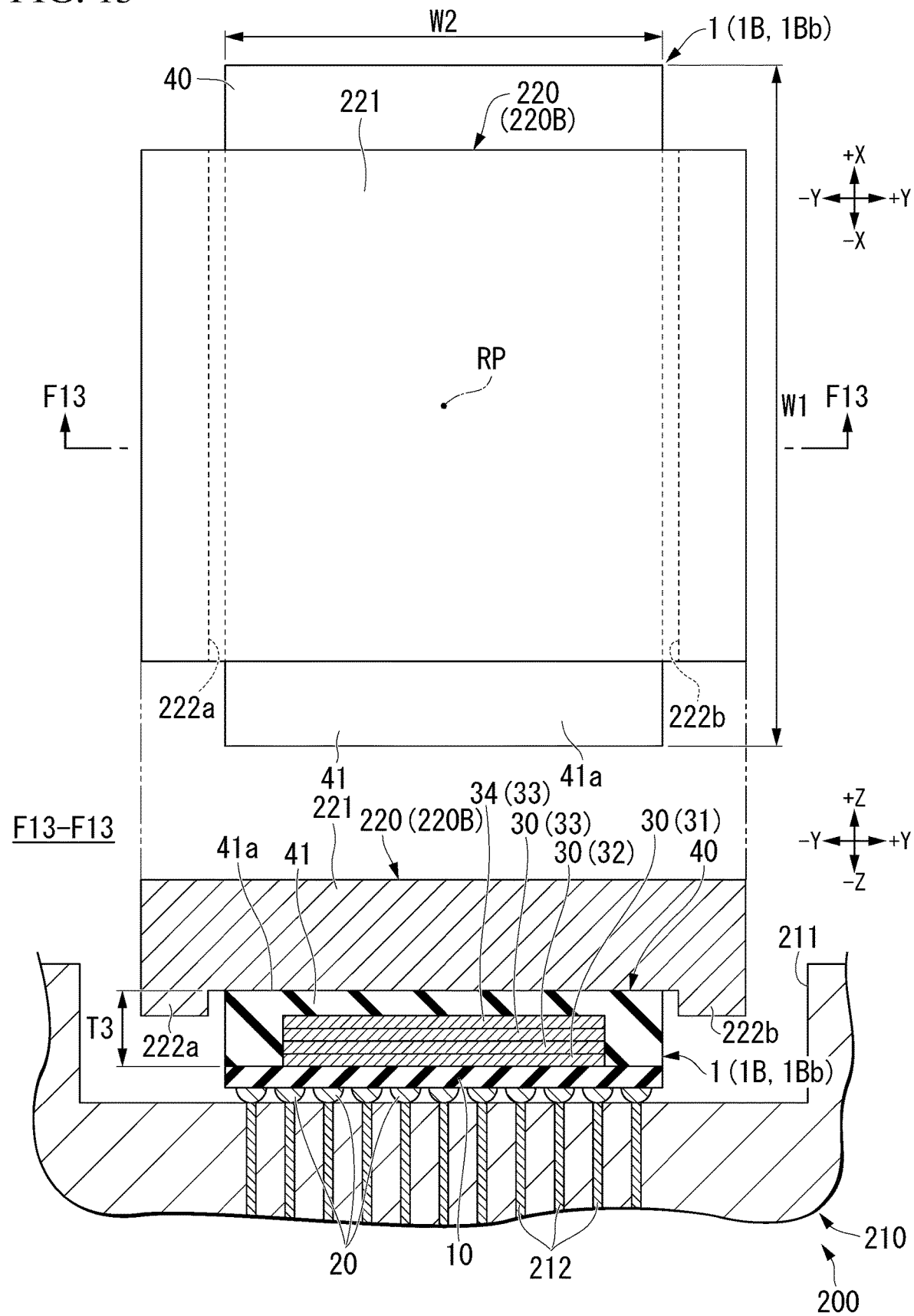
FIG. 13 is a view showing a second semiconductor device and the inspection component according to the second embodiment.

FIG. 13 is a view showing the second semiconductor device 1Bb and the inspection component 220B. The second semiconductor device 1Bb includes a board 10, a plurality of external connection terminals 20, a plurality of semiconductor memory chips 30, and a sealing resin portion 40. The sealing resin portion 40 of the second semiconductor device 1Bb does not have the second region 42. The sealing resin portion 40 has a thickness T3 with respect to the second surface 10b of the board 10. The thickness T3 of the sealing resin portion 40 of the second semiconductor device 1Bb is thicker than the thickness T1 of the sealing resin portion 40 of the first semiconductor device 1Ba. The thickness T3 of the second semiconductor device 1Bb is thicker by the number of semiconductor memory chips 30 of the second semiconductor device 1Bb being larger than the number of semiconductor memory chips 30 of the first semiconductor device 1Ba, for example. The second semiconductor device 1Bb has the same exterior as the first semiconductor device 1Ba when seen from the +Z direction side. That is, the second semiconductor device 1Bb (for example, the sealing resin portion 40) has the first width W1 in the X direction. The second semiconductor device 1Bb (for example, the sealing resin portion 40) has the second width W2 in the Y direction. The thickness of the board 10 of the first semiconductor device 1Ba and the thickness of the board 10 of the second semiconductor device 1Bb are the same as each other.

Next, the details of the inspection component 220B of the embodiment will be described. The pair of protruding portions 222a and 222b of the inspection component 220B are spaced apart from each other by a distance smaller than the first width W1 of the semiconductor devices 1Ba and 1Bb and larger than the second width W2 of the semiconductor devices 1Ba and 1Bb. The inspection component 220B is supported by a moving mechanism 230 to be rotatable by, for example, 90°, about a rotation axis RP in the Z direction. That is, the inspection component 220B is rotatable in a first state (refer to FIG. 12) in which the pair of protruding portions 222a and 222b are arranged in the longitudinal direction (the X direction) of the first semiconductor device 1Ba, and a second state (refer to FIG. 13) arranged in a direction intersecting the longitudinal direction of the semiconductor device 1Bb (for example, an orthogonal direction, the Y direction).

As shown in FIG. 12, in the first state, the protruding portions 222a and 222b of the inspection component 220B overlap the first semiconductor device 1Ba in the Z direction. In the first state, the protruding portions 222a and 222b of the inspection component 220B come into contact with the sealing resin portion 40 of the first semiconductor device 1Ba and press the first semiconductor device 1Ba toward the receiving portion 211 of the inspection device 200 by moving the inspection component 220B toward the first semiconductor device 1Ba with the moving mechanism 230.

As shown in FIG. 13, in the second state, the protruding portions 222a and 222b of the inspection component 220B do not overlap the second semiconductor device 1Bb in the Z direction. In the second state, the base 221 of the inspection component 220B overlaps the second semiconductor device 1Bb in the Z direction. In the second state, the base 221 of the inspection component 220B comes into contact with the sealing resin portion 40 of the second semiconductor device 1Bb and presses the second semiconductor device 1Bb toward the receiving portion 211 of the inspection device 200 by moving the inspection component 220B toward the second semiconductor device 1Bb with the moving mechanism 230.

With such a constitution, the cost related to the inspection may be reduced. For example, in the embodiment, the semiconductor device 1B has the first width W1 in the X direction (a first direction) and the second width W2 smaller than the first width W1 in the Y direction (a second direction). The inspection component 220B has a pair of protruding portions 222a and 222b which are spaced apart from each other by a distance smaller than the first width W1 and larger than the second width W2. With such a constitution, one inspection component 220B can be used for a plurality of types of semiconductor devices 1B having different thicknesses by rotating the inspection component 220B. Thus, the cost related to the inspection may be reduced.

Figure 14:
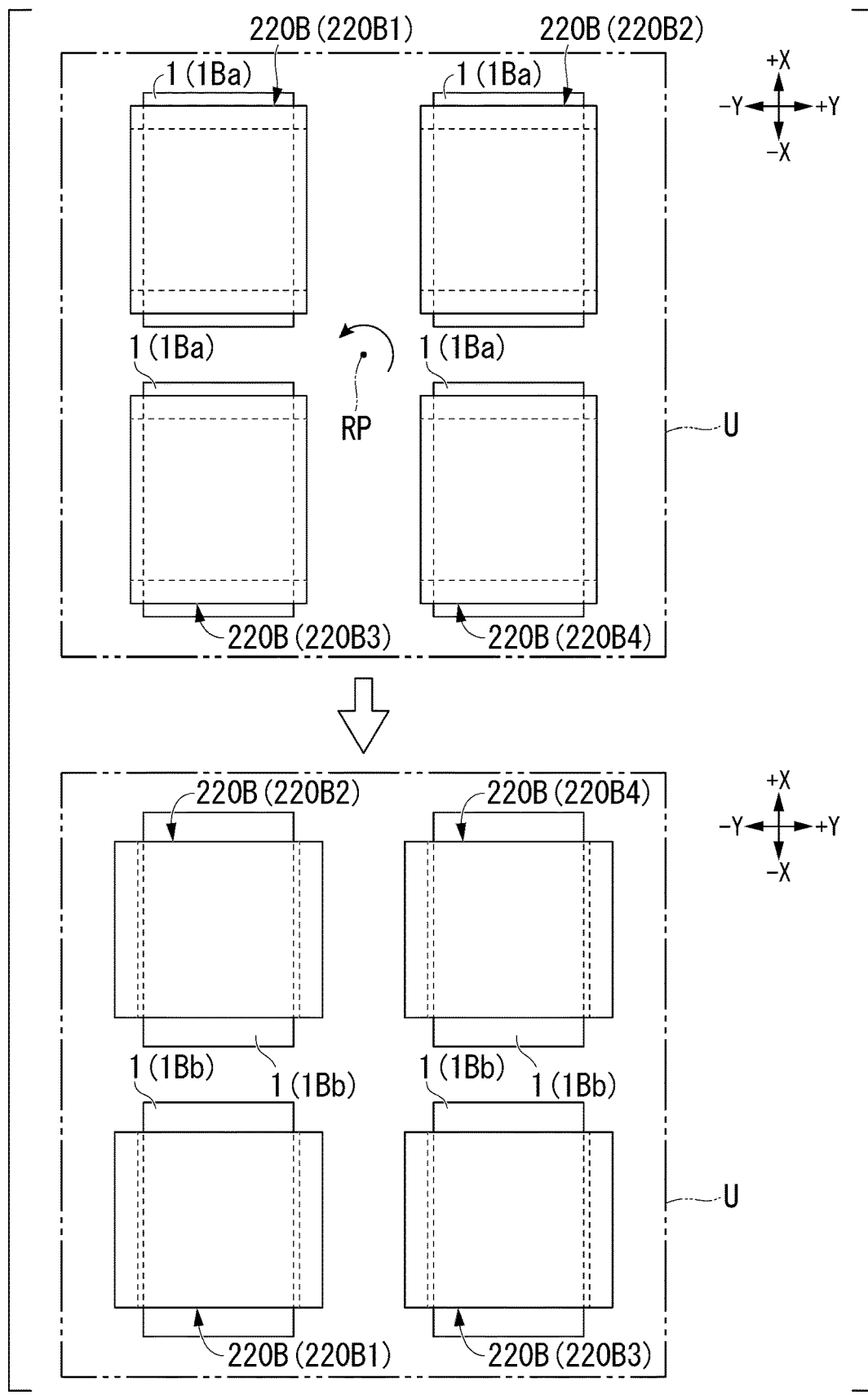
FIG. 14 is a plan view showing an example of an inspection device according to the second embodiment.

FIG. 14 is a plan view showing an example of the inspection device 200 according to the second embodiment. The inspection device 200 has, for example, a holding unit U in which a plurality of (for example, four) inspection components 220B (first to fourth inspection components 220B1, 220B2, 220B3, and 220B4) are integrally held. The holding unit U collectively rotates the plurality of (for example, four) inspection components 220B between the first state and the second state. With such a constitution, the number of rotation shafts RP may be reduced, and the cost of the inspection device 200 may be reduced. However, the inspection component 220B may be individually rotated as shown in FIGS. 12 and 13 instead of the above example.

Third Embodiment

Next, a third embodiment will be described with reference to FIGS. 15 and 16. The third embodiment is different from the first embodiment in that the inspection component 220 applies a force to the semiconductor device 1 by pulling the semiconductor device 1 from below. The constitution other than that described below in the third embodiment is the same as the constitution of the first embodiment.

The inspection device 200 of the embodiment can press the plurality of types of semiconductor devices 1 having different thicknesses by an inspection component 220C which is one type of inspection component 220. In the following, first, two types of semiconductor devices 1Ca and 1Cb (first and second semiconductor devices 1Ca and 1Cb) included in the plurality of types of semiconductor devices 1 will be described, and then the inspection component 220C will be described. Hereinafter, when the semiconductor devices 1Ca and 1Cb are not distinguished from each other, they are referred to as a semiconductor device 1C.

Figure 15:
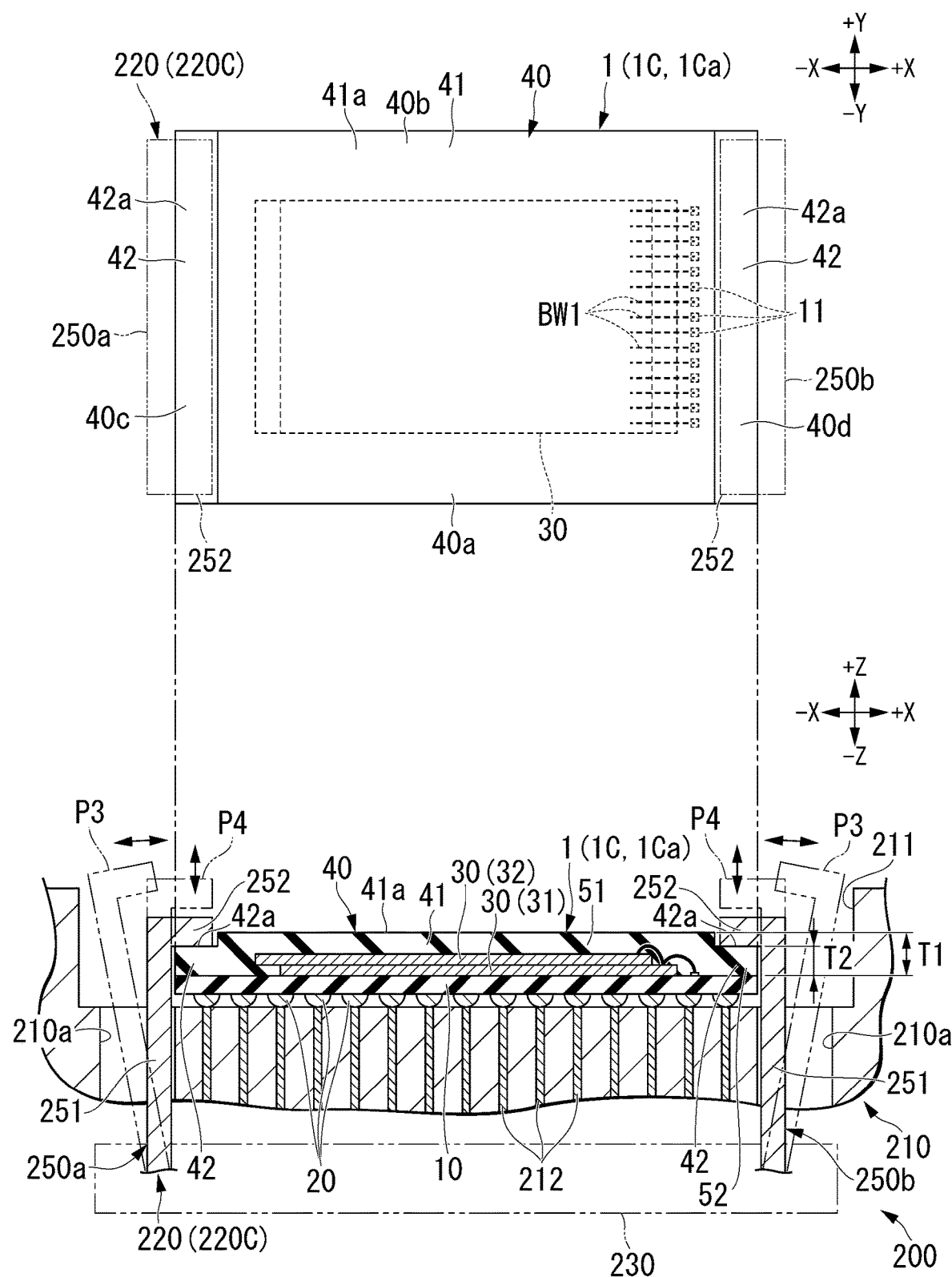
FIG. 15 is a view showing a first semiconductor device and an inspection component according to a third embodiment.

FIG. 15 is a view showing the first semiconductor device 1Ca and the inspection component 220C. The first semiconductor device 1Ca has, for example, the same constitution as the first semiconductor device 1Aa of the first embodiment. The first semiconductor device 1Ca has, for example, a second region 42 at both end portions of the sealing resin portion 40 in the X direction. However, the second region 42 may be provided in a frame shape along the four sides of the exterior of the sealing resin portion 40, may be provided at both end portions of the sealing resin portion 40 in the Y direction, or may be provided at the four corner portions of the sealing resin portion 40.

Figure 16:
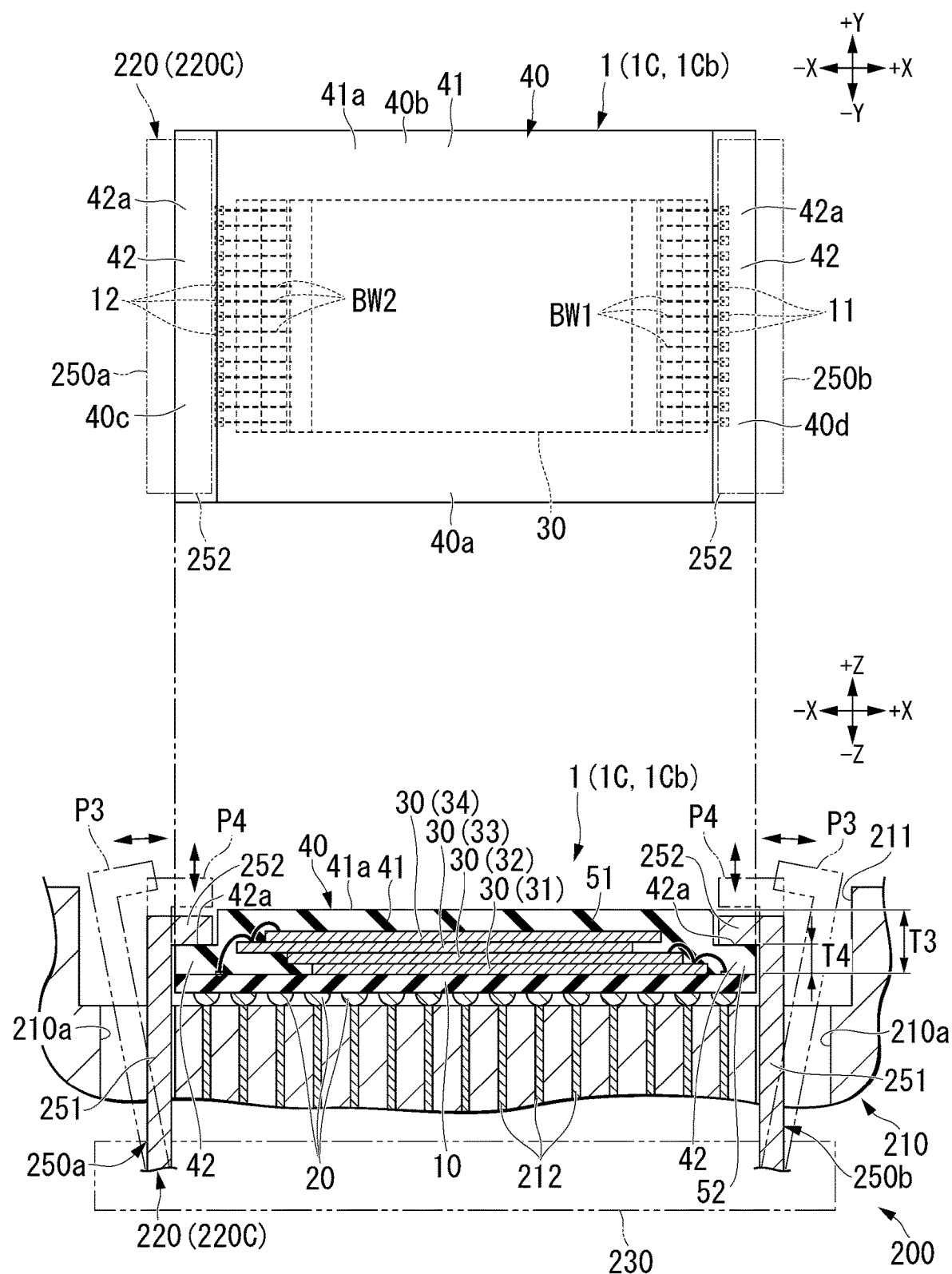
FIG. 16 is a view showing a second semiconductor device and the inspection component according to the third embodiment.

FIG. 16 is a view showing the second semiconductor device 1Cb and the inspection component 220C. The second semiconductor device 1Cb has, for example, the same constitution as the second semiconductor device 1Ab of the first embodiment. The second semiconductor device 1Cb has, for example, a second region 42 at both end portions of the sealing resin portion 40 in the X direction. However, the second region 42 may be provided in a frame shape along the four sides of the exterior of the sealing resin portion 40, may be provided at both end portions of the sealing resin portion 40 in the Y direction, or may be provided at the four corner portions of the sealing resin portion 40. A thickness of the board 10 of the first semiconductor device 1Ca and a thickness of the board 10 of the second semiconductor device 1Cb are the same as each other. The thickness T4 of the second region 42 of the second semiconductor device 1Cb is the same as the thickness T2 of the second region 42 of the first semiconductor device 1Ca.

As shown in FIGS. 15 and 16, the inspection device 200 according to the embodiment includes a moving mechanism 230 disposed below the receiving portion 211. The inspection component 220C has, for example, a pair of engaging portions 250a and 250b. Each of the engaging portions 250a and 250b has a base 251 and a hooking portion 252. The base 251 passes through a through hole 210a provided in a base 210 and extends from below to above inside the base 210. A lower end portion of the base 251 is connected to the moving mechanism 230. The hooking portion 252 is provided at an upper end portion of the base 251. In the embodiment, the hooking portion 252 is provided along a pair of end portions (for example, the third and fourth end portions 40c and 40d) of the sealing resin portion 40.

The engaging portions 250a and 250b are movable (for example, swingable) by the moving mechanism 230 between a first position P3 at which the hooking portion 252 does not overlap the semiconductor device 1C in the Z direction and a second position P4 in which the hooking portion 252 faces the second region 42 of the semiconductor device 1C from the side opposite to the receiving portion 211 of the inspection device 200. The engaging portions 250a and 250b are moved from the first position P3 to the second position P4 by the moving mechanism 230 and then moved in the −Z direction by the moving mechanism 230. Thus, the hooking portion 252 comes into contact with the second region 42 of the semiconductor device 1C and presses the semiconductor device 1C toward the receiving portion 211 of the inspection device 200 in a state in which the inspection component 220C is spaced apart from the first region 41 of the semiconductor device 1C. The hooking portion 252 is an example of the "pressing portion".

With such a constitution, as in the first embodiment, the cost related to the inspection may be reduced. However, instead of the above example, the hooking portion 252 may be provided to correspond only to central portions of a pair of end portions of the sealing resin portion 40 (for example, central portions of the third and fourth end portions 40c and 40d in the Y direction), and may be provided to correspond to only the four corner portions of the sealing resin portion 40.

Fourth Embodiment

Next, a fourth embodiment will be described with reference to FIGS. 17 and 18. The fourth embodiment is different from the first embodiment in that the inspection component 220 applies a force to the semiconductor device 1 by pulling the semiconductor device 1 from below. The constitution other than that described below in the fourth embodiment is the same as the constitution of the third embodiment.

In the inspection device 200 of the embodiment, a plurality of types of semiconductor devices 1 having different thicknesses can be pressed by an inspection component 220D which is one type of inspection component 220. In the following, first, two types of semiconductor devices 1Da and 1Db (first and second semiconductor devices 1Da and 1Db) included in the plurality of types of semiconductor devices 1 will be described, and then an inspection component 220D will be described. Hereinafter, when the semiconductor devices 1Da and 1Db are not distinguished from each other, they are referred to as a semiconductor device 1D.

Figure 17:
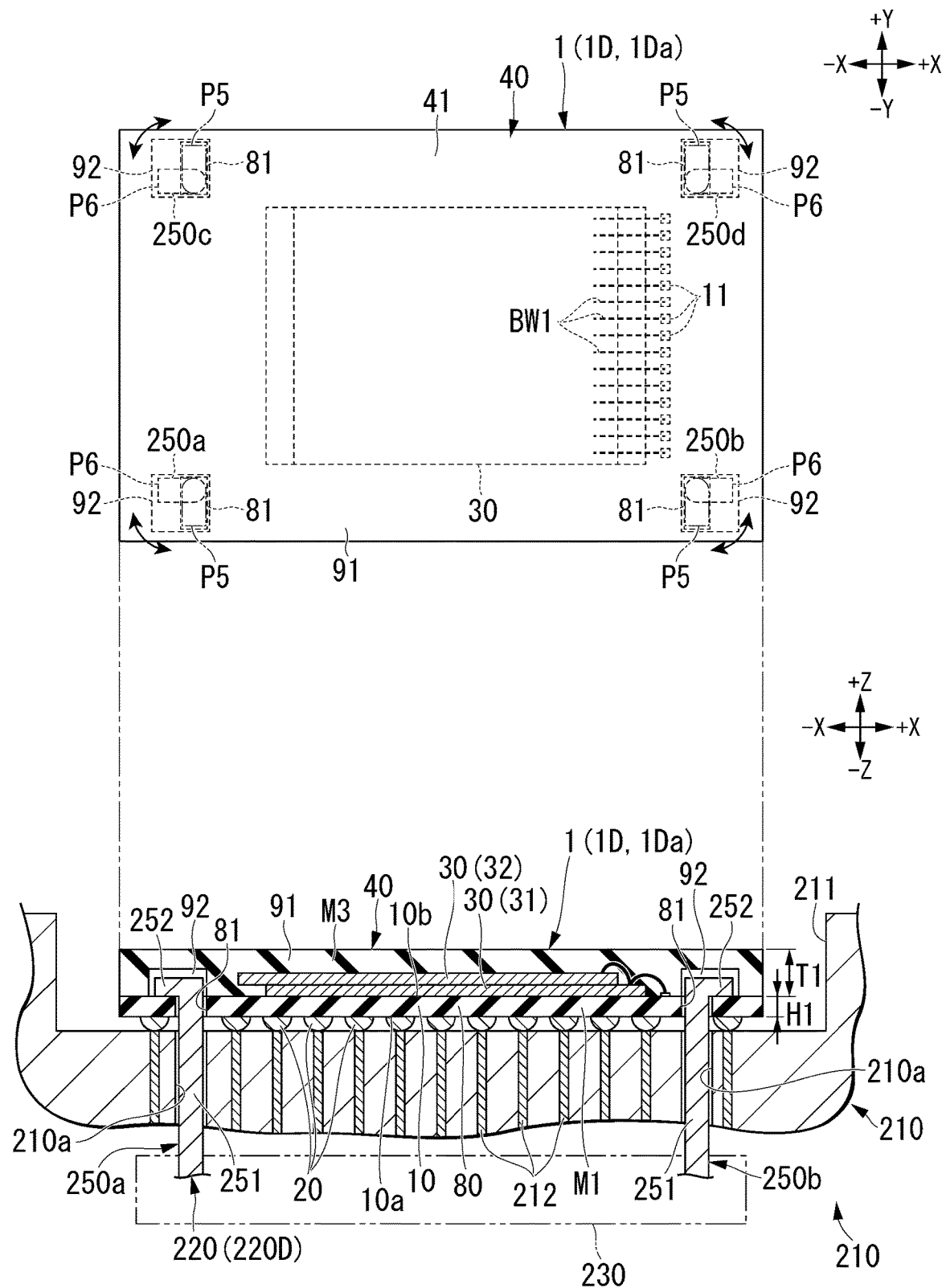
FIG. 17 is a view showing a first semiconductor device and an inspection component according to a fourth embodiment.

FIG. 17 is a view showing the first semiconductor device 1Da and the inspection component 220D. The sealing resin portion 40 of the first semiconductor device 1Da does not have the second region 42. On the other hand, in the embodiment, the board 10 has a main body 80 and a plurality of (for example, four) penetrating portions 81.

The main body 80 forms most of the board 10 and includes the above-described insulating board main body and a wiring pattern provided on the board main body. The main body 80 has a first surface 10a and a second surface 10b. The main body 80 is made of an insulating material M1. The insulating material M1 is a general insulating material for forming the board 10, such as a glass epoxy resin. The insulating material M1 is an example of the "first insulating material".

The penetrating portion 81 is a cavity provided in the main body 80 and extends from the first surface 10a to the second surface 10b of the board 10. The first semiconductor device 1Da has a distance H1 from the first surface 10a to the second surface 10b of the board 10.

The plurality of penetrating portions 81 are separately disposed on both sides of the semiconductor memory chip 30 in the X direction. Similarly, the plurality of penetrating portions 81 are separately disposed on both sides of the semiconductor memory chip 30 in the Y direction. The "both sides in the X direction" is not limited to a case in which the penetrating portions 81 are arranged in the X direction with respect to a target object (here, the semiconductor memory chip 30) and may include a case in which the penetrating portions 81 are disposed to be displaced with respect to the target object in a direction different from the X direction (for example, the Y direction), as shown in FIG. 15. This definition is the same for the Y direction. The penetrating portion 81 is, for example, a rectangular or elliptical elongated hole having a longitudinal direction in the Y direction. However, the penetrating portion 81 may be a rectangular or elliptical elongated hole having a longitudinal direction in a direction different from the Y direction.

The sealing resin portion 40 includes a first portion (an insulator main body) 91 and second portions (cavities) 92. The first portion 91 forms most of the sealing resin portion 40 and covers the plurality of semiconductor memory chips 30 from the side opposite to the board 10. The first portion 91 is made of an insulating material M3. The insulating material M3 is, for example, a general mold resin material which forms the sealing resin portion 40. The insulating material M3 is an example of the "third insulating material".

The second portion 92 is provided adjacent to the penetrating portion 81 inside the first portion 91. The second portion 92 is a cavity (a cutout) provided inside the first portion 91. The second portion 92 is formed larger than the penetrating portion 81 in a direction different from the longitudinal direction of the penetrating portion 81 when seen from the +Z direction side.

Figure 18:
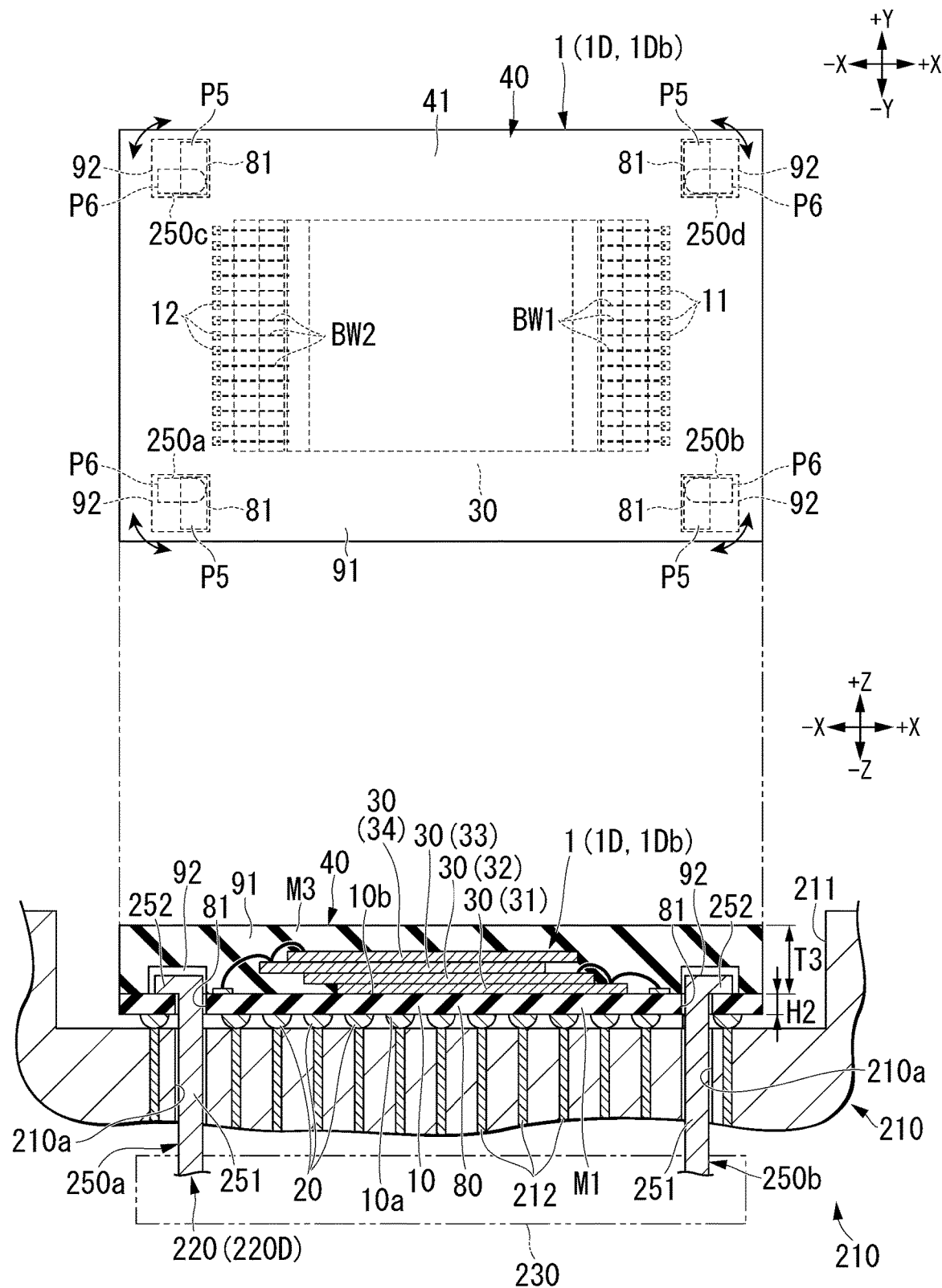
FIG. 18 is a view showing a second semiconductor device and the inspection component according to the fourth embodiment.

FIG. 18 is a view showing the second semiconductor device 1Db and the inspection component 220D. The second semiconductor device 1Db has a main body 80, penetrating portions 81, a first portion 91, and second portions 92, like the first semiconductor device 1Da. A distance H2 (that is, a thickness of the board 10 of the second semiconductor device 1Db) from the first surface 10a to the second surface 10b of the board 10 in the second semiconductor device 1Db is the same as the distance H1 from the first surface 10a to the second surface 10b of the board 10 in the first semiconductor device 1Da (that is, a thickness of the board 10 of the first semiconductor device 1Da).

As shown in FIGS. 17 and 18, the inspection device 200 includes a moving mechanism 230 disposed below the receiving portion 211. The inspection component 220D has, for example, a plurality of engaging portions 250a, 250b, 250c, and 250d. Each of the engaging portions 250a, 250b, 250c, and 250d has, for example, a base 251 and hooking portions 252. The base 251 passes through a through hole 210a provided in the base 210 and extends from below to above inside the base 210. A lower end of the base 251 is connected to the moving mechanism 230. The hooking portion 252 is provided at an upper end portion of the base 251.

The engaging portions 250a, 250b, 250c, and 250d are inserted into the second portions (the cavities) 92 provided inside the semiconductor device 1D and can be engaged with the semiconductor device 1D. In the embodiment, the engaging portions 250a, 250b, 250c, and 250d are movable (for example, rotatable) by the moving mechanism 230 between a first position P5 (indicated by a two-dot chain line in the drawing) at which the hooking portion 252 does not overlap the semiconductor device 1D in the Z direction, and a second position P6 (indicated by a broken line or a solid line in the drawing) at which the hooking portion 252 faces the second surface 10b of the board 10 of the semiconductor device 1D from the side opposite to the receiving portion 211 of the inspection device 200. The engaging portions 250a, 250b, 250c, and 250d are moved from the first position P5 to the second position P6 by the moving mechanism 230 and then moved in the −Z direction by the moving mechanism 230. Thus, the hooking portion 252 comes into contact with the board 10 of the semiconductor device 1D and presses the semiconductor device 1D toward the receiving portion 211 of the inspection device 200. The hooking portion 252 is an example of the "pressing portion".

With such a constitution, as in the first embodiment, the cost of the inspection may be reduced. In the embodiment, the inspection component 220D is inserted into the second portion (the cavity) 92 provided inside the semiconductor device 1D, engaged with the semiconductor device 1D, and applies a force, which is directed to the receiving portion 211 of the inspection device 200, on the semiconductor device 1D. With such a constitution, the engaging portions 250a, 250b, 250c, and 250d can be disposed in an area which overlaps the semiconductor device 1D when seen from the +Z direction side. Thus, the inspection device 200 may be miniaturized.

However, the number and an arrangement of the engaging portions 250a, 250b, 250c, and 250d are not limited to the above example. For example, only two engaging portions may be separately provided on both sides of the semiconductor memory chip 30 in the X direction (or both sides of the semiconductor memory chip 30 in the Y direction).

Modified Example

Figure 19:
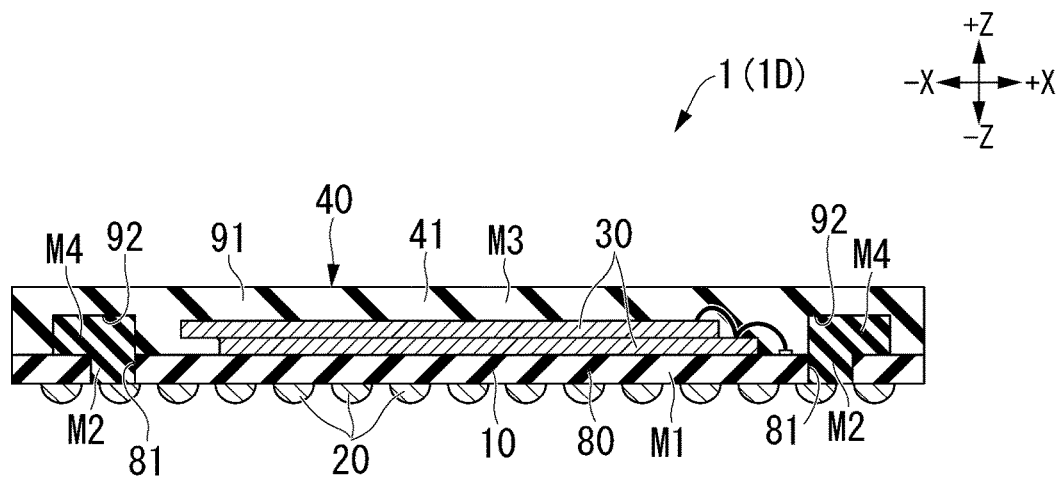
FIG. 19 is a cross-sectional view showing a second semiconductor device according to a modified example of the fourth embodiment.

FIG. 19 shows a semiconductor device 1D according to a modified example of the fourth embodiment. As shown in FIG. 19, in the above-described semiconductor device 1D, the penetrating portions 81 may be filled with the insulating material M2, and the second portions 92 may be filled with the insulating material M4 after the inspection. The insulating material M2 and the insulating material M4 are, for example, a thermoplastic or thermosetting synthetic resin. The insulating material M2 is an example of the "second insulating material". The insulating material M2 is, for example, a material different from the insulating material M1. The insulating material M4 is an example of the "fourth insulating material". The insulating material M4 is, for example, a material different from the insulating material M3. However, the insulating material M4 may be the same material as the insulating material M3. The insulating material M2 and the insulating material M4 may be the same material as each other.

Although some embodiments and modified examples have been described above, the embodiments and modified examples are not limited to the above examples. For example, the above-described embodiments and modified examples may be realized in combination with each other.

Figure 20:
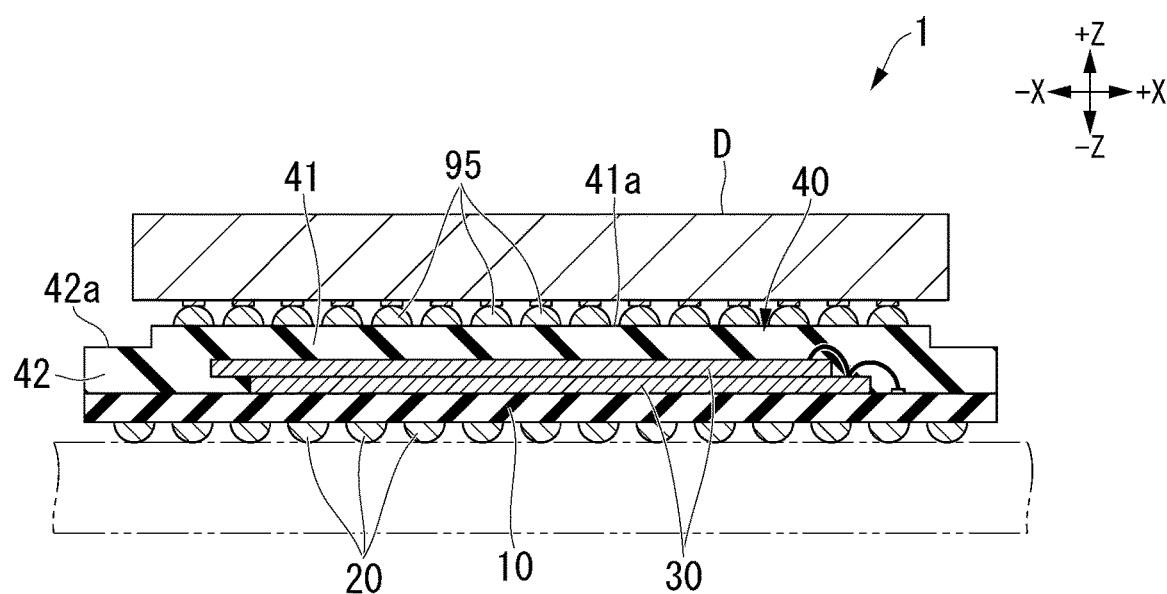
FIG. 20 is a cross-sectional view showing a semiconductor device according to a modified example of the first to fourth embodiments.

FIG. 20 shows a semiconductor device 1 according to a modified example. As shown in FIG. 20, the semiconductor device 1 may have external connection terminals 95 (for example, electrical connection portions such as solder balls or pads to which the solder balls are connected) on the surface 41a of the first region 41 of the sealing resin portion 40. Another semiconductor device D can be stacked on the semiconductor device 1 of the modified example in the Z direction. With the constitutions according to the first to fourth embodiments or the modified examples, for the semiconductor device 1 of the modified example, a force which is directed to the receiving portion 211 of the inspection device 200 can be applied to the lower external connection terminal 20 without applying the force to the upper external connection terminal 95.

According to at least one of the above-described embodiments, the semiconductor device has, for example, an insulator having a first region and a second region thinner than the first region. With such a constitution, it is possible to reduce the cost related to the inspection.

Hereinafter, some semiconductor devices, inspection components, and inspection devices will be described.

[1] A semiconductor device includes:

a board including a first surface and a second surface, the second surface being located on a side opposite to the first surface;

a plurality of external connection terminals on the first surface;

a first semiconductor component located on a side opposite to the plurality of external connection terminals with respect to the board; and an insulator including a first region and a second region, the first region having a first thickness in a thickness direction of the board, the second region being located on an outer peripheral side of the first region and having a second thickness thinner than the first thickness in the thickness direction, the insulator covering the first semiconductor component from a side opposite to the board.

[2]: the semiconductor device according to [1], wherein the second region is provided at a position at which it does not overlap the first semiconductor component in the thickness direction.

[3]: the semiconductor device according to [1] or [2], wherein a difference between the first thickness and the second thickness is smaller than the second thickness.

[4]: the semiconductor device according to any one of [1] to [3], wherein the second thickness is thicker than a thickness of the first semiconductor component in the thickness direction.

[5]: the semiconductor device according to any one of [1] to [4], further including:

a second semiconductor component located on a side opposite to the board with respect to the first semiconductor component; and a bonding wire connected to the second semiconductor component, wherein the second region has a surface parallel to the board, and the surface is located closer to the board in the thickness direction than at least a part of the bonding wire.

[6]: the semiconductor device according to any one of [1] to [5], further including a controller component between the board and the first semiconductor component, wherein the second thickness is thicker than a sum of a thickness of the first semiconductor component in the thickness direction and a thickness of the controller component in the thickness direction.

[7]: the semiconductor device according to any one of [1] to [6], the semiconductor device further includes a controller component located on the second surface of the board, and when seen in the thickness direction, a shortest distance between the controller component and the second region is shorter than a shortest distance between the first semiconductor component and the second region.

[8] An inspection component includes an engaging portion configured to be inserted into a cavity provided inside a semiconductor device, to be engaged with the semiconductor device, and to apply a force directed to a receiving portion of the inspection device to the semiconductor device.

[9]: An inspection device includes:

the inspection component according to [8], a base including a receiving portion on which the semiconductor device is to be mounted, and a moving mechanism configured to move the inspection component toward the receiving portion.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a board including a first surface and a second surface, the second surface being located on a side opposite to the first surface;
    a plurality of external connection terminals on the first surface;
    a plurality of semiconductor memory chips located on a side opposite to the plurality of external connection terminals with respect to the board, the plurality of semiconductor memory chips being stacked each other in a thickness direction of the board;
    a controller component between the board and the plurality of semiconductor memory chips; and
    an insulator including a first region and a second region, the first region having a first thickness in the thickness direction of the board, the second region being located on an outer peripheral side of the first region and having a second thickness thinner than the first thickness in the thickness direction, the insulator covering the plurality of semiconductor memory chips from a side opposite to the board, the insulator being in contact with the plurality of semiconductor memory chips and the controller, wherein the plurality of semiconductor memory chips are mounted on the controller, the plurality of semiconductor memory chips including a first semiconductor memory chip which is closest to the board among the plurality of semiconductor memory chips, the first semiconductor memory chip being in contact with the controller,
    the plurality of semiconductor memory chips includes a second semiconductor memory chip which is furthest from the board among the plurality of semiconductor memory chips, the second semiconductor memory chip has a third surface covered with the insulator,
    the second region has a fourth surface which is parallel to the second surface of the board, and the fourth surface of the second region is located closer to the board in the thickness direction of the board than the third surface of the second semiconductor memory chip, and
    the second thickness is thicker than a sum of a thickness of the second semiconductor memory chip in the thickness direction and a thickness of the controller component in the thickness direction.

2. An inspection component for inspection of a semiconductor device, the semiconductor device including a board, a plurality of external connection terminals, a first semiconductor component, and an insulator, the board including a first surface and a second surface, the second surface being located on a side opposite to the first surface, the plurality of external connection terminals being on the first surface, the first semiconductor component being located on a side opposite to the plurality of external connection terminals with respect to the board, the insulator including a first region and a second region, the first region having a first thickness in a thickness direction of the board, the second region being located on an outer peripheral side of the first region and having a second thickness thinner than the first thickness in the thickness direction, and the insulator covering the first semiconductor component from a side opposite to the board, the inspection component comprising:
    a pressing portion configured to come into contact with the second region of the insulator in the thickness direction in a state in which the inspection component is spaced apart from the first region of the insulator.

3. The inspection component according to claim 2, wherein:
    the inspection component includes a base configured to face the first region of the insulator,
    the pressing portion protrudes from the base, and
    an amount of protrusion of the pressing portion with respect to the base is larger than a difference between the first thickness and the second thickness.

4. An inspection device for inspection of a semiconductor device, the semiconductor device including a board, a plurality of external connection terminals, a first semiconductor component, and an insulator, the board including a first surface and a second surface, the second surface being located on a side opposite to the first surface, the plurality of external connection terminals being on the first surface, the first semiconductor component being located on a side opposite to the plurality of external connection terminals with respect to the board, the insulator including a first region and a second region, the first region having a first thickness in a thickness direction of the board, the second region being located on an outer peripheral side of the first region and having a second thickness thinner than the first thickness in the thickness direction, and the insulator covering the first semiconductor component from a side opposite to the board, the inspection device comprising:
an inspection component including a pressing portion capable of coming into contact with the second region of the insulator in the thickness direction in a state in which the inspection component is spaced apart from the first region of the insulator;
a base including a receiving portion on which the semiconductor device is to be mounted; and
a moving mechanism configured to move the inspection component toward the receiving portion.

5. A semiconductor device comprising a first semiconductor device which has the same external connection terminals as those of a second semiconductor device, each of the first semiconductor device and the second semiconductor device comprising:
a board including a first surface and a second surface, the second surface being located on a side opposite to the first surface;
the external connection terminals on the first surface;
two or more semiconductor memory chips located on a side opposite to the first surface with respect to the board; and
an insulator including a first region and a second region, the second region being located on an outer peripheral side of the first region and being thinner than the first region in a thickness direction of the board, the insulator covering the one or more semiconductor memory chips from a side opposite to the board,
wherein
a number of the two or more semiconductor memory chips of the first semiconductor device is different from a number of the two or more semiconductor memory chips of the second semiconductor device,
the first region of the first semiconductor device has a first thickness in the thickness direction, the second region of the first semiconductor device has a second thickness in the thickness direction, the first region of the second semiconductor device has a third thickness in the thickness direction, and the second region of the second semiconductor device has a fourth thickness in the thickness direction,
the first thickness is different from the third thickness, and the second thickness is the same as the fourth thickness.

6. The semiconductor device according to claim 1, further comprising:
an electronic component covered with the second region on the insulator,
wherein
the controller is mounted on the second surface,
the electronic component is mounted on the second surface.

7. A semiconductor device comprising:
a board including a first surface and a second surface, the second surface being located on a side opposite to the first surface;
a plurality of external connection terminals on the first surface;
a plurality of semiconductor memory chips located on a side opposite to the plurality of external connection terminals with respect to the board, the plurality of semiconductor memory chips being stacked each other in a thickness direction of the board; and
an insulator including a first region and a second region, the first region having a first thickness in the thickness direction of the board, the second region being located on an outer peripheral side of the first region and having a second thickness thinner than the first thickness in the thickness direction, the insulator covering the plurality of semiconductor memory chips from a side opposite to the board,
wherein
the plurality of semiconductor memory chips includes a semiconductor memory chip which is furthest from the board among the plurality of semiconductor memory chips, the semiconductor memory chip has a third surface covered with the insulator,
the second region has a fourth surface which is parallel to the second surface of the board, and the fourth surface of the second region is located closer to the board in the thickness direction of the board than the third surface of the semiconductor memory chip,
the first region of the insulator includes an end portion adjacent to the second region,
the end portion includes an inclined portion that inclines and extends in a direction different from the thickness direction so as to be located outside the semiconductor device as a position in the inclined portion is closer to the board, and
the inclined portion is configured to receive a protruding portion of an inspection component in a case where the inspection component is moved toward the semiconductor device in a state in which the semiconductor device is misaligned with respect to the inspection component.

8. The inspection component according to claim 2, wherein:
the second region of the insulator has a third surface which is parallel with the first surface, and
the pressing portion is configured to come into contact with the third surface of the second region of the insulator in the thickness direction.

9. The inspection component according to claim 2, wherein:
the pressing portion is configured to come into contact with only a top surface of the second region.

10. The inspection component according to claim 2, wherein:
the pressing portion is configured to come into contact with the second region of the insulator without contacting a side surface of the second region.

11. The inspection component according to claim 2, wherein:
the pressing portion is configured to come into contact with the second region of the insulator in the thickness direction and to press the second region of the insulator so that the semiconductor device is pressed toward a plurality of inspection terminals of an inspection device, the plurality of inspection terminals being located on a side opposite to the inspection component with respect to the semiconductor device.

12. The inspection device according to claim 4, wherein:
the second region of the insulator has a third surface which is parallel with the first surface, and
the pressing portion is configured to come into contact with the third surface of the second region of the insulator in the thickness direction.

13. The inspection device according to claim 4, wherein:
the pressing portion is configured to come into contact with only a top surface of the second region.

14. The inspection device according to claim 4, wherein:
the pressing portion is configured to come into contact with the second region of the insulator without contacting a side surface of the second region.

15. The inspection device according to claim 4, wherein:
the base includes a plurality of inspection terminals,
the pressing portion is configured to come into contact with the second region of the insulator in the thickness direction and to press the second region of the insulator so that the semiconductor device is pressed toward the plurality of inspection terminals.

16. The semiconductor device according to claim 5, wherein:
the second thickness is greater than a total thickness of the two or more semiconductor memory chips of the first semiconductor device, and
the fourth thickness is smaller than a total thickness of the two or more semiconductor memory chips of the second semiconductor device.

17. The semiconductor device according to claim 5, wherein:
the second thickness is thinner than half the first thickness, and
the fourth thickness is thinner than half the third thickness.

\* \* \* \* \*